United States Patent
Lee et al.

(10) Patent No.: US 11,630,246 B2
(45) Date of Patent: Apr. 18, 2023

(54) DIFFUSION LENS AND DISPLAY DEVICE HAVING SAME

(71) Applicant: Samsung Electronics Co., Ltd., Suwon-si (KR)

(72) Inventors: Seungjae Lee, Suwon-si (KR); Yonghun Kwon, Suwon-si (KR); Chunsoon Park, Suwon-si (KR); Keunbum Lee, Suwon-si (KR); Sungho Jun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/250,380

(22) PCT Filed: Jun. 28, 2019

(86) PCT No.: PCT/KR2019/007874
§ 371 (c)(1),
(2) Date: Jan. 13, 2021

(87) PCT Pub. No.: WO2020/013489
PCT Pub. Date: Jan. 16, 2020

(65) Prior Publication Data
US 2021/0271005 A1    Sep. 2, 2021

(30) Foreign Application Priority Data
Jul. 13, 2018    (KR) .................. 10-2018-0081859

(51) Int. Cl.
*G02B 3/02*    (2006.01)
*G02B 5/02*    (2006.01)
*G02B 3/00*    (2006.01)

(52) U.S. Cl.
CPC ............. *G02B 3/02* (2013.01); *G02B 5/021* (2013.01); *G02B 5/0278* (2013.01); *G02B 2003/0093* (2013.01)

(58) Field of Classification Search
CPC . G02B 3/02; G02B 5/02; G02B 5/021; G02B 5/0278; G02B 2003/0093;
(Continued)

(56) References Cited

U.S. PATENT DOCUMENTS 7,443,609 B2    10/2008    Yoon et al.
7,649,697 B2    1/2010    Yoon et al.
(Continued)

FOREIGN PATENT DOCUMENTS

CN    103883985 A    6/2014
CN    104456416 A    3/2015
(Continued)

OTHER PUBLICATIONS

International Search Report and Written Opinion of the International Searching Authority in connection with International Application No. PCT/KR2019/007874 dated Oct. 24, 2019, 12 pages.
(Continued)

*Primary Examiner* — Jie Lei

(57) ABSTRACT

A diffusion lens includes a concave first lens surface, a convex second lens surface such that part of light incident on the first lens surface is output from the second lens surface, a side surface extending from a periphery of the second lens surface in a vertical direction of the diffusion lens such that part of the rest of the light incident on the first lens surface is output from the side surface, and a bottom surface extending from a periphery of the first lens surface in a horizontal direction of the diffusion lens to meet a periphery of the side surface. Rates of change of the first and second lens surfaces have the same sign. A pattern is formed on the
(Continued)

side surface and the bottom surface to diffuse the light through the side surface and diffuse the light reflected by the bottom surface.

14 Claims, 21 Drawing Sheets

(58) Field of Classification Search
CPC ............... G02B 19/00; G02B 19/0014; G02B 19/0061; F21V 5/04; F21V 5/007; F21V 7/05; F21V 13/04; G02F 1/133603; G02F 1/133606; G02F 1/133611
USPC ....... 359/599, 385, 390, 707, 613, 601, 798, 359/800
See application file for complete search history.

(56) References Cited

U.S. PATENT DOCUMENTS

| | | |
|---|---|---|
| 8,227,969 B2 | 7/2012 | Yamaguchi et al. |
| 8,487,526 B2 | 7/2013 | Yamaguchi et al. |
| 9,347,643 B2 | 5/2016 | Yamaguchi et al. |
| 9,546,773 B2 | 1/2017 | Yamaguchi et al. |
| 9,752,750 B2 | 9/2017 | Yamaguchi et al. |
| 2006/0227431 A1 | 10/2006 | Yoon et al. |
| 2008/0278944 A1 | 11/2008 | Yoon et al. |
| 2010/0270907 A1 | 10/2010 | Yamaguchi et al. |
| 2014/0177235 A1 | 6/2014 | Lin |
| 2015/0009452 A1 | 1/2015 | Lee |
| 2016/0123554 A1 | 5/2016 | Kang |
| 2016/0201875 A1* | 7/2016 | Kang ................ G02B 19/0014 362/311.06 |
| 2016/0327239 A1 | 11/2016 | Lin |

FOREIGN PATENT DOCUMENTS

| | | |
|---|---|---|
| CN | 204358634 U | 5/2015 |
| CN | 204648115 U | 9/2015 |
| EP | 2821836 A1 | 1/2015 |
| KR | 10-2006-0106172 A | 10/2006 |
| KR | 10-2013-0079113 A | 7/2013 |
| KR | 10-2016-0051292 A | 5/2016 |
| KR | 10-2016-0074371 A | 6/2016 |

OTHER PUBLICATIONS

Supplementary European Search Report dated Jun. 29, 2021, in connection with European Application No. 19833755.2, 6 pages.
Request for the Submission of an Opinion dated Nov. 18, 2022 in connection with Korean Patent Application No. 10-2018-0081859, 13 pages.

* cited by examiner

DIFFUSION LENS AND DISPLAY DEVICE HAVING SAME

CROSS-REFERENCE TO RELATED APPLICATIONS

This application is a 371 National Stage of International Application No. PCT/KR2019/007874, filed Jun. 28, 2019, which claims priority to Korean Patent Application No. 10-2018-0081859, filed Jul. 13, 2018, the disclosures of which are herein incorporated by reference in their entirety.

BACKGROUND

1. Field

Embodiments of the disclosure described herein relate to a technology associated with a diffusion lens for diffusing light of a light source.

2. Description of Related Art

Recently, thin flat panel display devices, such as a liquid crystal display (LCD), an organic light emitting diode (OLED) display, and the like, have been actively developed.

The LCD may include a liquid crystal display panel for displaying an image and a backlight panel for supplying light to the liquid crystal display panel. Because the liquid crystal display panel is a non-emissive element, the backlight panel for supplying light may be located. Depending on an arrangement state of liquid crystal, the liquid crystal display panel may adjust the amount by which light emitted from the backlight panel passes through the liquid crystal display panel.

Backlight panels are classified into an edge type backlight panel and a direct type backlight panel depending on the positions of light sources. The edge type backlight panel has a structure in which light sources are installed on side surfaces of a light guide plate, and the direct type backlight panel has a structure in which a plurality of light sources are disposed under a liquid-crystal light-guide plate. The direct type backlight panel may use diffusion lenses that diffuse light of a plurality of light emitting elements under a display panel so as to uniformly supply the light to the display panel.

Furthermore, this technology for supplying light to the display panel may be used for surface light source lighting that can be applied to a general lighting device or an interior lighting device of a refrigerator.

SUMMARY

The plurality of light emitting elements of the direct type backlight panel may be located under the display panel to ensure high luminance. However, the luminance may not be uniform depending on the positions of the plurality of light emitting elements. In particular, when point light sources, such as light emitting diodes (LEDs), are used as the light emitting elements, a light bounce phenomenon may arise in which light is concentrated on a specified region of a diffusion plate, and luminance unevenness may be caused in the diffusion plate by the light bounce phenomenon. An image output through the display panel to which light is supplied from the backlight panel having the luminance unevenness may distract a user. Light emitting elements for compensating for the luminance unevenness may be additionally installed, but the additional installation may lead to an increase in manufacturing costs.

A diffusion lens according to various embodiments of the disclosure may diffuse light generated from a light emitting element to prevent the light from intensively reaching a specified region of a diffusion plate, thereby uniformly improving light distribution in the diffusion plate.

A diffusion lens according to an embodiment of the disclosure includes a first lens surface having a concave curved shape such that light generated from a light source is incident on the first lens surface, a second lens surface having a convex curved shape such that part of the light incident on the first lens surface is output from the second lens surface, a side surface extending from a periphery of the second lens surface in a vertical direction of the diffusion lens such that part of the rest of the light incident on the first lens surface is output from the side surface, and a bottom surface extending from a periphery of the first lens surface in a horizontal direction of the diffusion lens to meet a periphery of the side surface. Rates of change of the first lens surface and the second lens surface have the same sign, and a pattern in which arbitrary shapes are irregularly disposed or a pattern in which specified shapes are regularly or irregularly disposed is formed on the side surface and the bottom surface to diffuse the light passing through the side surface and diffuse the light reflected by the bottom surface.

A display device according to an embodiment of the disclosure includes a backlight panel including a plurality of light emitting diodes (LEDs) disposed at specified intervals, a plurality of diffusion lenses disposed on the plurality of LEDs, respectively, and a diffusion plate that diffuses light incident from the plurality of diffusion lenses, and a display panel that displays an image.

According to the embodiments of the disclosure, the diffusion lens has a diffusion lens surface formed such that there is no inflection point in the rate of change of curvature, thereby achieving a high production yield and an excellent assembly tolerance and uniformly improving light distribution in a diffusion plate even when the distance between the light source element and the diffusion plate is short. Furthermore, the diffusion lens has, on the side surface and the bottom surface thereof, the pattern in which the arbitrary shapes or the specified shapes are regularly or irregularly disposed and diffuses light generated from a light emitting element to other regions, thereby more uniformly improving distribution of light reaching the diffusion plate.

Moreover, the display device having the diffusion lenses installed therein maintains the luminance of light in the diffusion plate of the backlight panel at a specified value or more by using a small number of light emitting elements, thereby reducing manufacturing costs of the display device.

In addition, the disclosure may provide various effects that are directly or indirectly recognized.

BRIEF DESCRIPTION OF THE DRAWINGS

With regard to description of the drawings, identical or similar reference numerals may be used to refer to identical or similar components.

DETAILED DESCRIPTION

Hereinafter, various embodiments of the disclosure may be described with reference to accompanying drawings. Accordingly, those of ordinary skill in the art will recognize that modification, equivalent, and/or alternative on the various embodiments described herein can be variously made without departing from the scope and spirit of the disclosure.

Figure 1:
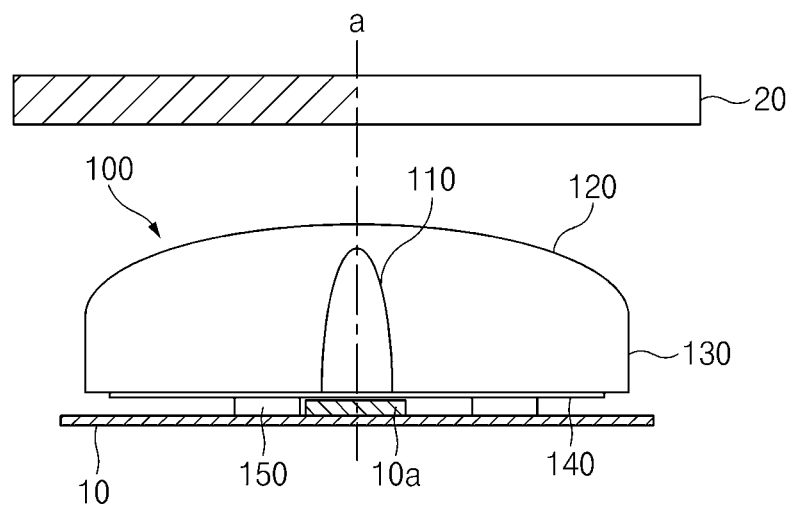
FIG. 1 is a view illustrating a diffusion lens according to various embodiments.

FIG. 1 is a view illustrating a diffusion lens according to various embodiments.

Referring to FIG. 1, the diffusion lens 100 may be disposed to cover a light emitting element (or, a light source) 10a (e.g., a light emitting diode (LED)) that is installed on a printed circuit board (PCB) 10. A diffusion plate 20 may be spaced apart upward from the diffusion lens 100. An air gap may exist between the diffusion plate 20 and the diffusion lens 100. Accordingly, light generated from the light emitting element 10a may be sent out from a backlight panel through the diffusion lens 100 and the diffusion plate 20.

According to an embodiment, the diffusion lens 100 may be formed in a three-dimensional structure to cover the light emitting element 10a. According to an embodiment, the diffusion lens 100 may have a bilaterally symmetric shape with respect to an optical axis "a". Furthermore, the diffusion lens 100 may have rotational symmetry with respect to the optical axis "a". The direction of the optical axis "a" may be, for example, an axis extending from the light emitting element 10a in a vertical direction.

According to an embodiment, the diffusion lens 100 may be formed of a material through which the light generated from the light emitting element 10a is able to transmit. For example, the diffusion lens 100 may be formed of a material having a transmittance of 70% or more and a refractive index of 1.40 to 1.70 in the visible region.

According to an embodiment, the diffusion lens 100 may include a first lens surface 110, a second lens surface 120, a side surface 130, a bottom surface 140, and a support 150. Not all the components illustrated in FIG. 1 are essential, and the diffusion lens 100 of the disclosure may include more or fewer components.

According to an embodiment, the first lens surface 110 may be formed inside the diffusion lens 100. For example, the first lens surface 110 may be formed by a light source element receiving section formed inside the diffusion lens 100. According to an embodiment, a vertical section of the first lens surface 110 may have a curved shape. Furthermore, the first lens surface 110 may have rotational symmetry with respect to the optical axis "a". Accordingly, the first lens surface 110 may have a concave curved shape.

According to an embodiment, the light emitting element 10a may be received in the light source receiving section of the diffusion lens 100. Accordingly, the light generated by the light emitting element 10a may be incident on the first lens surface 110. According to an embodiment, the light incident on the first lens surface 110 may be firstly refracted by the first lens surface 110. Furthermore, the light incident on the first lens surface 110 may be delivered to another surface of the diffusion lens 100 through the inside of the diffusion lens 100.

According to an embodiment, the second lens surface 120 may be formed on an upper surface of the diffusion lens 100. According to an embodiment, a vertical section of the second lens surface 120 may have a convex curved shape. Furthermore, the second lens surface 120 may have rotational symmetry with respect to the optical axis "a". Accordingly, the second lens surface 120 may have a convex curved shape.

According to an embodiment, part of the light incident on the first lens surface 110 from the light emitting element 10a may be delivered to the second lens surface 120. According to an embodiment, the light delivered to the second lens surface 120 may be output through the second lens surface 120, or may be Fresnel-reflected by the second lens surface 120 and delivered back to the inside of the diffusion lens 100. According to an embodiment, the light output through the second lens surface 120 may be secondly refracted by the second lens surface 120.

According to an embodiment, the side surface 130 may extend in the vertical direction of the diffusion lens 100. For example, the side surface 130 may extend from a periphery of the second lens surface 120 in the vertical direction of the diffusion lens 100. According to an embodiment, a vertical section of the side surface 130 may have a linear shape. Furthermore, the side surface 130 may have rotational symmetry with respect to the optical axis "a". Accordingly, the side surface 130 may have a planar shape.

According to an embodiment, part of the rest of the light incident on the first lens surface 110 from the light emitting element 10a may be output through the side surface 130.

According to an embodiment, the bottom surface 140 may extend in a horizontal direction of the diffusion lens 100. For example, the bottom surface 140 may extend from a periphery of the first lens surface 110 in the horizontal direction of the diffusion lens 100 and may meet a periphery of the side surface 130.

According to an embodiment, the bottom surface 140 may reflect part of the light incident on the first lens surface 110 toward the inside of the diffusion lens 100. The reflected light may be output through, for example, the second lens surface 120 and the side surface 130. According to an embodiment, the bottom surface 140 may reflect the light reflected by the second lens surface 120 toward the inside of the diffusion lens 100 again. The light reflected again may be output through, for example, the second lens surface 120 and the side surface 130.

According to an embodiment, the support 150 may space the diffusion lens 100 apart from the installed PCB 10 by a specified distance. According to an embodiment, the support 150 may extend from the bottom surface 140 in the vertical direction of the diffusion lens 100. According to an embodiment, the diffusion lens 100 may include at least three supports. Accordingly, the diffusion lens 100 may be stably installed on the PCB 10.

According to an embodiment, the first lens surface 110 and the second lens surface 120 may have aspheric shapes (e.g., elliptical shapes) and may be formed according to Equation 1 below.

$$z(r) = \frac{c*r^2}{1+\sqrt{1-(1-k)*c^{2}*r^2}} + A_1*r + A_2*r^2 + A_3*r^3 + \ldots + A_n*r^n \quad \text{Equation 1}$$

Here, c is the curvature of a lens, k is a conic constant, and $A_1$ to $A_n$ are aspheric coefficients. As the first lens surface 110 and the second lens surface 120 are formed by Equation 1 in which a second-order aspheric term (e.g., $A_2*r^2$) is included, luminance in the diffusion plate 20 may maintain linearity from a peak point to a point at which the luminance is 50% of the luminance at the peak point. For example, the coefficient (e.g., $A_2$) of the second-order aspheric term may not be 0 in Equation 1 in which the second-order aspheric term is included. The peak point may be a point coincident with the optical axis "a" of the diffusion lens 100. In particular, the shape of the second lens surface 120, which is an important factor in maintaining the linearity, may be formed by Equation 1 in which the second-order aspheric term is included.

According to an embodiment, the first lens surface 110 may have a conic constant $-1<k_1<0$, the second lens surface 120 may have a conic constant $0<k_2<20$, and the first lens surface 110 and the second lens surface 120 may be formed according to Equation 1. According to another embodiment, the curvature $c_1$ and the effective diameter $D_1$ of the first lens surface 110 may have the relation $5<c_1*D_1<15$, the curvature $c_2$ and the effective diameter $D_2$ of the second lens surface 120 may have the relation $0.5<c_2*D_2<2$, and the first lens surface 110 and the second lens surface 120 may be formed according to Equation 1.

According to an embodiment, the second lens surface 120 may have a smaller rate of change than the first lens surface 110 located at the same position in the vertical direction. Accordingly, the diameter of the first lens surface 110 may be larger than the diameter of the second lens 120.

According to an embodiment, the rates of change of curvatures of the first lens surface 110 and the second lens surface 120 may have the same sign. In other words, inflection points at which the signs of the rates of change of curvatures of the first lens surface 110 and the second lens surface 120 are changed may not exist. Accordingly, the diffusion lens 100 may have a high production yield and an excellent assembly tolerance. In particular, when the sign of the rate of change of curvature of the second lens surface 120 is the same, the rate of change of curvature of the second lens surface 120 may be minimized, and therefore light distribution in the diffusion plate 20 may be uniformly improved even though the distance between the light source element 10a and the diffusion plate 20 is short.

According to an embodiment, a pattern in which arbitrary shapes are irregularly disposed may be formed on the side surface 130 and the bottom surface 140. The pattern in which the arbitrary shapes are irregularly disposed may be formed, for example, by etching (or, corroding) the side surface 130 and the bottom surface 140. According to an embodiment, the arbitrary shapes of the pattern formed on the side surface 130 may have a height of 100 µm or less. Furthermore, the arbitrary shapes of the pattern formed on the bottom surface 140 may have a height of 30 µm or less.

According to an embodiment, a pattern in which specified shapes are regularly or irregularly disposed may be formed on the side surface 130 and the bottom surface 140. The pattern in which the specified shapes are regularly or irregularly disposed may be formed through a mold on which engraved or embossed shapes corresponding to the specified shapes are formed. According to an embodiment, the specified shapes of the pattern formed on the side surface 130 and the bottom surface 140 may be one of pyramid shapes, triangular prism shapes, or hemisphere shapes. According to an embodiment, the specified shapes of the pattern formed on the bottom surface 140 may have a height of 300 µm or less.

According to an embodiment, the pattern formed on the side surface 130 and the bottom surface 140 may diffuse the light generated by the light emitting element 10a. For example, the pattern formed on the side surface 130 may change the path of the light output through the side surface 130 and may prevent the output light from being concentrated on a specified region of the diffusion plate 20. In other words, the pattern formed on the side surface 130 may disperse light concentrated on the specified region of the diffusion plate 20. Furthermore, the pattern formed on the bottom surface 140 may change the path of the light reflected by the bottom surface 140 and may disperse light concentrated on the optical axis "a" of the diffusion lens 100.

Figure 2:
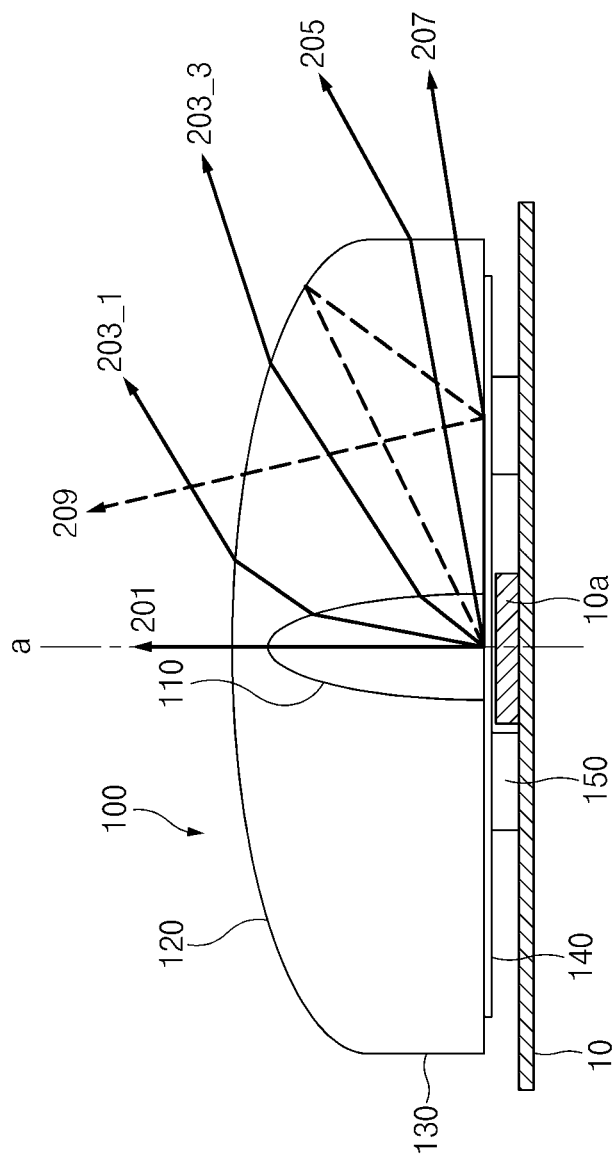
FIG. 2 is a view illustrating paths of light by the diffusion lens according to various embodiments.

FIG. 2 is a view illustrating paths of light by the diffusion lens according to various embodiments.

Referring to FIG. 2, light generated by the light emitting element 10a installed on the PCB 10 may be incident on the first lens surface 110, and the light incident on the first lens surface 110 may be output through the second lens surface 120 and the side surface 130.

According to an embodiment, the light incident on the first lens surface 110 from the light emitting element 10a may be output through a first path 1. For example, light incident on the center of the first lens surface 110 from the light emitting element 10a may be output through the center of the second lens surface 120. According to an embodiment, the first path 1 may be formed on the optical axis "a". According to an embodiment, the largest amount of light of the light incident on the first lens surface 110 from the light emitting element 10a may be output through the first path 201. Accordingly, a peak point of maximum luminance may be formed at a point where the optical axis "a" and a diffusion plate (e.g., the diffusion plate 20 of FIG. 1) meet.

According to an embodiment, the light incident on the first lens surface 110 from the light emitting element 10a may be output through a second path 203_1 and a third path 203_3. For example, the light incident on the first lens surface 110 from the light emitting element 10a may be output through the second lens surface 120. According to an embodiment, the light output through the second path 203_1 and the third path 203_3 may be refracted by the first lens surface 110 and the second lens surface 120 and may be diffused outside the diffusion lens 100.

According to an embodiment, the light incident on the first lens surface 110 from the light emitting element 10a may be output through a fourth path 205. For example, the light incident on the first lens surface 110 from the light emitting element 10a may be output through the side surface 130. According to an embodiment, the light output through the fourth path 205 may be refracted by the side surface 130 having the pattern formed thereon and may be diffused outside the diffusion lens 100.

According to an embodiment, the light incident on the first lens surface 110 from the light emitting element 10a may be output through a fifth path 207. For example, the light incident on the first lens surface 110 from the light emitting element 10a may be reflected by the bottom surface 140 and may be output through the side surface 130. According to an embodiment, the light output through the fifth path 207 may be reflected by the bottom surface 140 having the pattern formed thereon and may be diffused outside the diffusion lens 100 through the side surface 130.

According to an embodiment, the light incident on the first lens surface 110 from the light emitting element 10a may be output through a sixth path 209. For example, the light incident on the first lens surface 110 from the light emitting element 10a may be reflected by the second lens surface 120 and delivered to the bottom surface 140 and may be reflected by the bottom surface 140 again and output through the second lens surface 120. The pattern formed on the bottom surface 140 may decrease the amount by which the light reflected again is output toward the center (or, the optical axis "a") of the diffusion lens 100. According to an embodiment, the light output through the sixth path 209 may be reflected (or, re-reflected) by the bottom surface 140 having the pattern formed thereon and may be diffused outside the diffusion lens 100 through the second lens surface 140.

Accordingly, the light generated by the light emitting element 10a may be diffused outside the diffusion lens 100 by being refracted or reflected by the patterns formed on the side surface 130 and the bottom surface 140.

Figure 3:
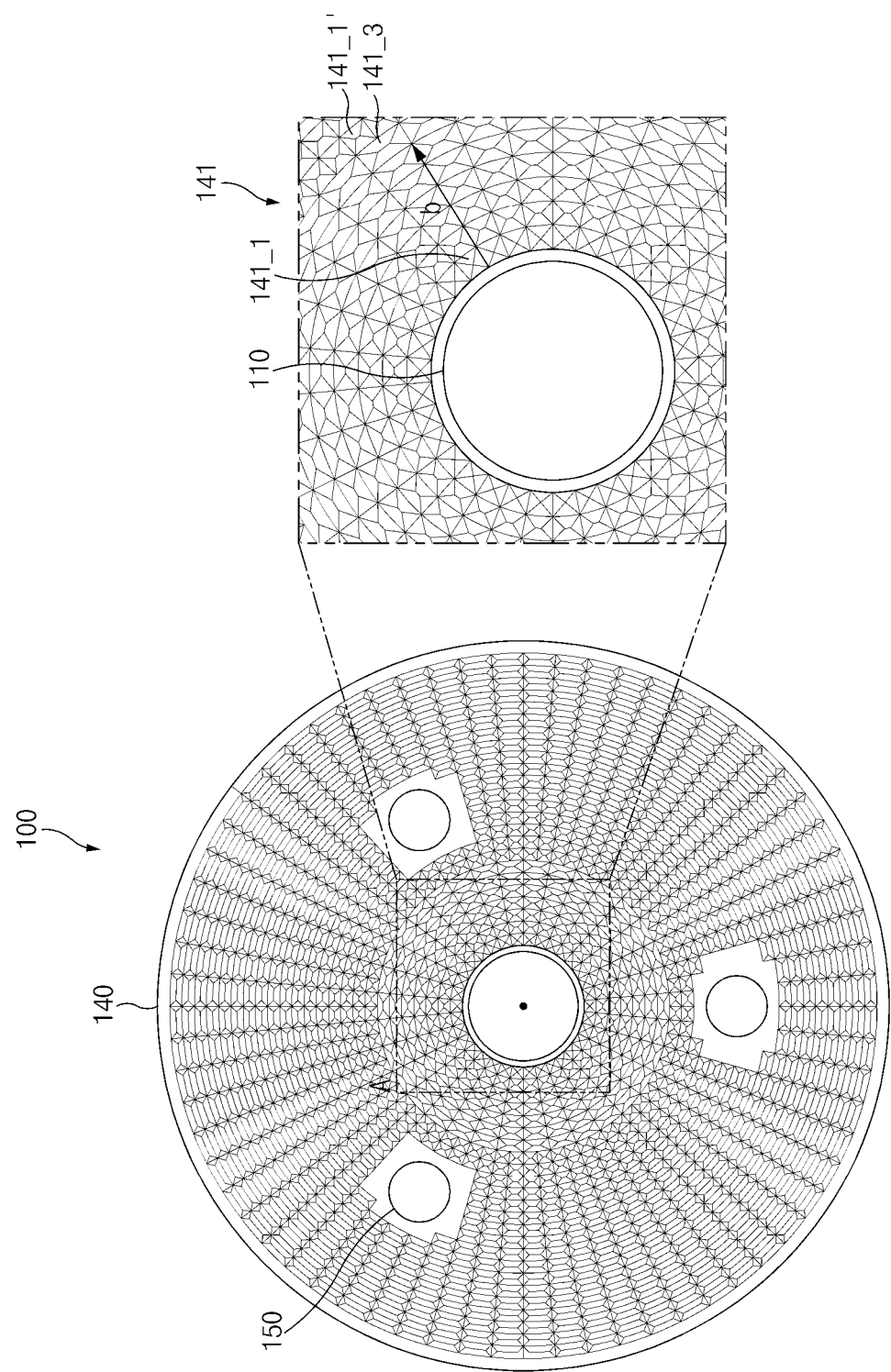
FIG. 3 is a view illustrating specified shapes regularly arranged on a bottom surface of the diffusion lens according to an embodiment.

FIG. 3 is a view illustrating specified shapes regularly arranged on the bottom surface of the diffusion lens according to an embodiment.

Referring to FIG. 3, a plurality of pyramid shapes 141 may be radially disposed on the bottom surface 140 of the diffusion lens 100. The plurality of pyramid shapes 141 may be formed to a specified distance "r" from the center of the bottom surface 140. The supports 150, together with the plurality of pyramid shapes 141, may be formed on the bottom surface 140.

According to an embodiment, in an enlarged view of region "A" marked on the bottom surface 140, the plurality of pyramid shapes 141 may be disposed in a specified direction "b" to form a radial pattern. For example, the plurality of pyramid shapes 141 having different widths may be disposed in the specified direction "b". The width of second pyramid shapes 141_3 disposed in the specified direction "b" may be greater than, for example, the width of first pyramid shapes 141_1. Furthermore, third pyramid shapes 141_1' disposed in the specified direction "b" may be similar to the first pyramid shapes 141_1. When the second pyramid shapes 141_3 having a width two times greater than the width of the first pyramid shapes 141_1 are disposed, the third pyramid shapes 141_1' having a width similar to the width of the first pyramid shapes 141_1 may be disposed.

Figure 4:
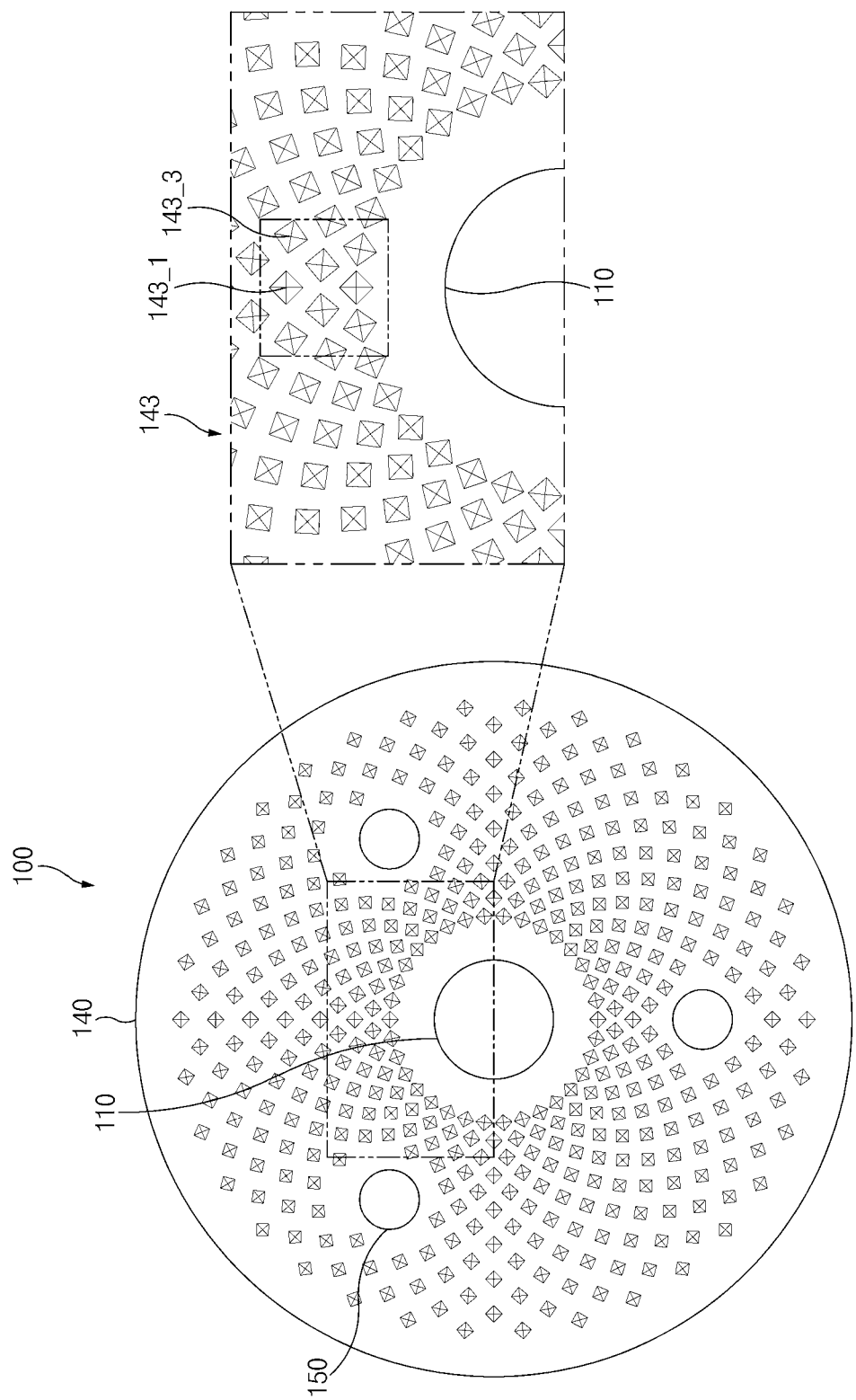
FIG. 4 is a view illustrating specified shapes irregularly arranged on the bottom surface of the diffusion lens according to an embodiment.

FIG. 4 is a view illustrating specified shapes irregularly arranged on the bottom surface of the diffusion lens according to an embodiment.

Referring to FIG. 4, a plurality of pyramid shapes 141 may be randomly disposed on the bottom surface 140 of the diffusion lens 100. The plurality of pyramid shapes 143 may be formed to the specified distance "r" from the center of the bottom surface 140. The supports 150, together with the plurality of pyramid shapes 143, may be formed on the bottom surface 140.

According to an embodiment, in an enlarged view of region "B" marked, the plurality of pyramid shapes 143 identical to one another may be disposed. A specified number of pyramid shapes may be disposed in a specified region "c". Pyramid shapes 143_1 and 143_3 included in the plurality of pyramid shapes 143 may be identical to each other.

Figure 5:
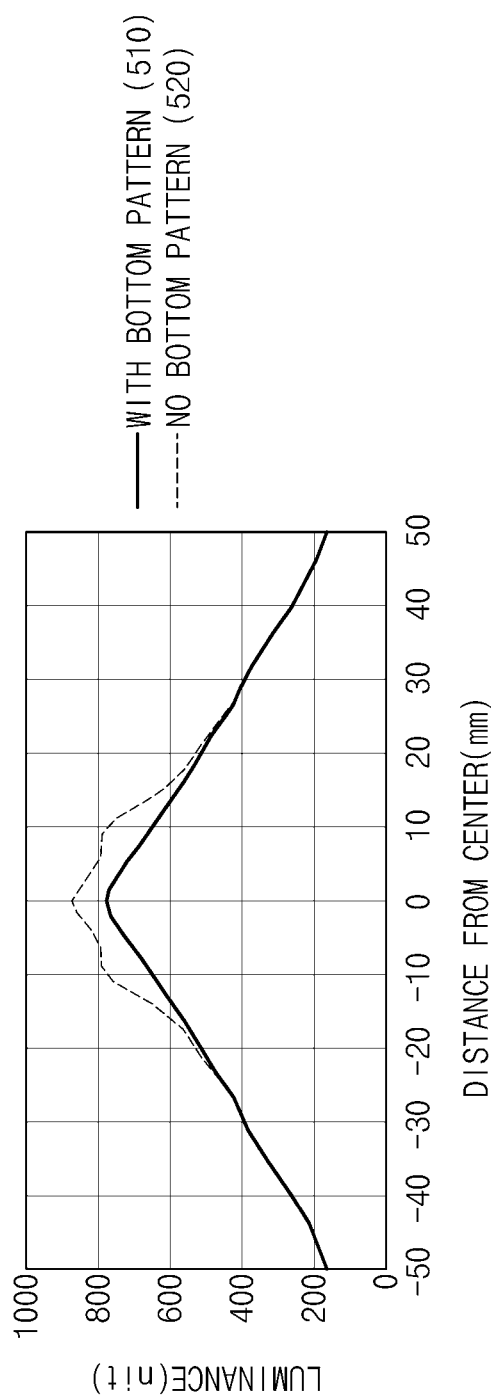
FIG. 5 is a graph depicting distribution of light diffused by a pattern formed on the bottom surface of the diffusion lens according to various embodiments.

FIG. 5 is a graph depicting distribution of light diffused by a pattern formed on the bottom surface of the diffusion lens according to various embodiments.

Referring to FIG. 5, the distribution of light diffused by the diffusion lens 100 may be recognized through luminance in the diffusion plate 20 that the diffused light reaches. In other words, a point at which the luminance in the diffusion plate 20 is high may refer to a point that a large amount light reaches.

According to an embodiment, when the diffusion lens 100 has the pattern on the bottom surface 140 thereof (510), luminance in a specified region "T" of the diffusion plate 20 may be low, as compared with when the diffusion lens 100 has no pattern on the bottom surface 140 thereof (520). In other words, light output toward the center of the diffusion lens 100 through the diffusion lens 100 may be decreased. Accordingly, the distribution of light that reaches the diffusion plate 20 may be uniformly improved.

Figure 6:
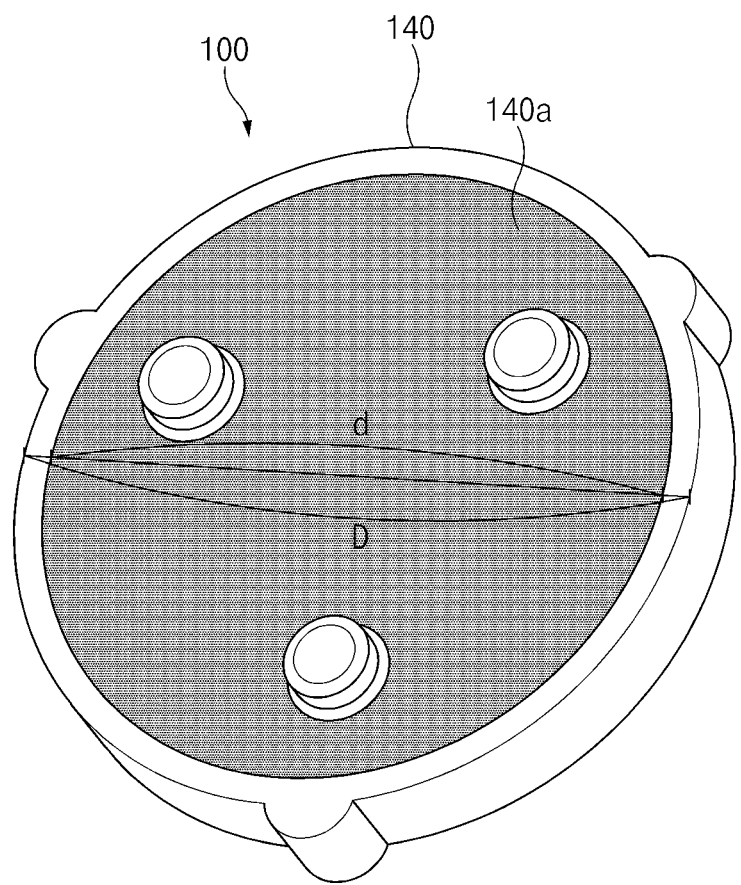
FIG. 6 is a graph depicting luminance at a peak point depending on the diameter of a region where a pattern is formed on the bottom surface of the diffusion lens according to various embodiments.

FIG. 6 is a graph depicting luminance at a peak point depending on the diameter of a region where a pattern is formed on the bottom surface of the diffusion lens according to various embodiments.

Referring to FIG. 6, the pattern may be formed on part of the bottom surface 140 of the diffusion lens 100.

According to an embodiment, the percentage of a region 140a where the pattern is formed on the bottom surface 140 may be expressed as the ratio (d/D) between the diameter "d" of the patterned region 140a and the diameter "D" of the bottom surface 140.

According to an embodiment, luminance at a specified point may be measured depending on the diameter ratio (d/D) between the diameter "d" of the patterned region 140a and the diameter "D" of the bottom surface 140. The specified point may be a peak point in a diffusion plate (e.g., the diffusion plate 20 of FIG. 1). The peak point may be, for example, a point where the optical axis of the diffusion lens 100 and the diffusion plate (e.g., the diffusion plate 20 of FIG. 1) meet. Accordingly, the measured luminance may represent a state in which light output toward the center of the diffusion lens 100 is concentrated. When the luminance at the peak point is low, the width by which light is diffused from side to side may be increased, and the width (or, the half-width) between left and right points at which the luminance is 50% of the luminance at the peak point may be expanded.

Figure 7:
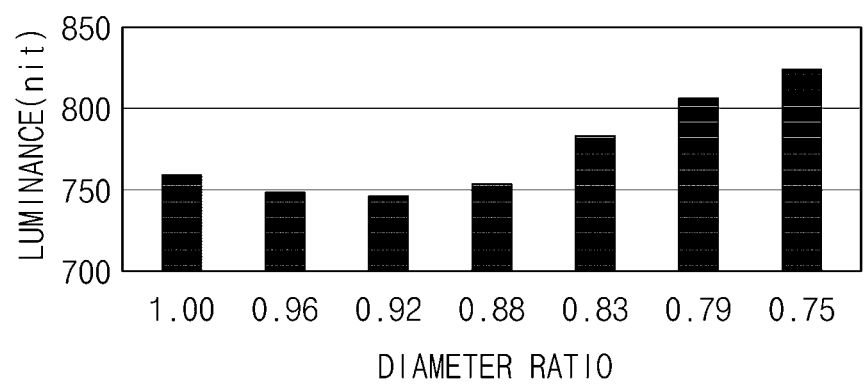
FIG. 7 is a graph depicting luminance distribution depending on the diameter of the region where the pattern is formed on the bottom surface of the diffusion lens according to various embodiments.

FIG. 7 is a graph depicting luminance distribution depending on the diameter of the region where the pattern is formed on the bottom surface of the diffusion lens according to various embodiments.

Referring to FIG. 7, the luminance at the peak point may be measured in the diameter ratio (d/D) range of 0.75 to 1.00, in which the diameter ratio (d/D) is the ratio between the diameter "d" of the patterned region 140a and the diameter "D" of the bottom surface 140 in FIG. 6.

According to an embodiment, the luminance at the peak point by a specified light source may be measured to be lowest when the diameter ratio (d/D) is 0.92. Accordingly, a relatively small amount of light may be concentrated on the center of the diffusion lens 100 when the diameter ratio (d/D) ranges from 0.90 to 0.94.

Figure 8:
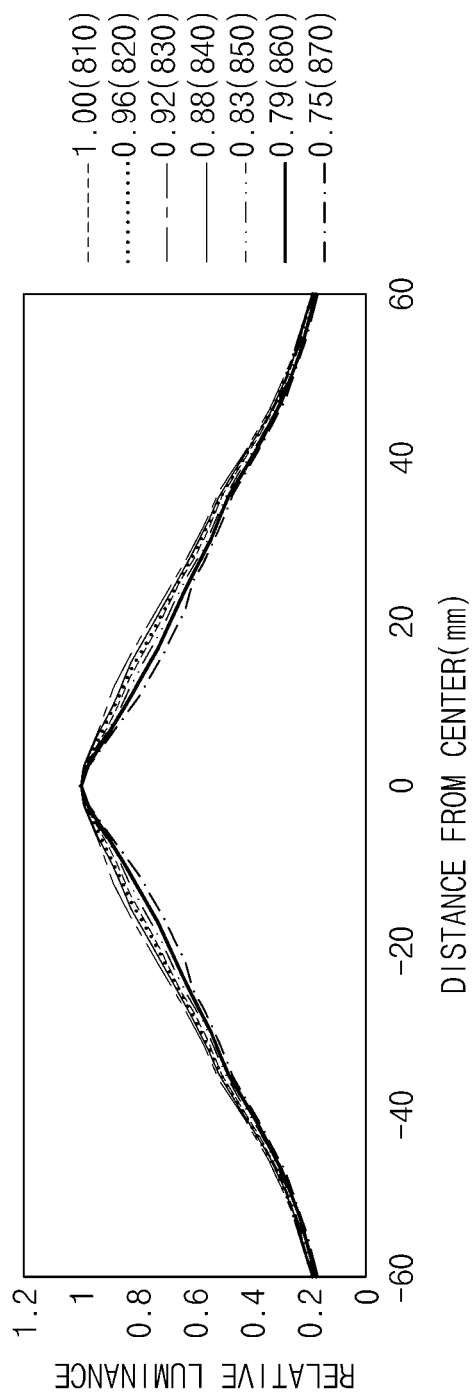
FIG. 8 is a graph depicting relative luminance depending on the diameter of the region where the pattern is formed on the bottom surface of the diffusion lens according to various embodiments.

FIG. 8 is a graph depicting relative luminance depending on the diameter of the region where the pattern is formed on the bottom surface of the diffusion lens according to various embodiments.

Referring to FIG. 8, the relative luminance with the peak point as the center in the diameter ratio (d/D) range of 0.75 to 1.00 is illustrated.

According to an embodiment, the difference in luminance, with the peak point as the center, may be relatively small when the diameter ratio (d/D) between the diameter "d" of the patterned region 140a and the diameter "D" of the bottom surface 140 in FIG. 6 ranges from 0.90 to 0.94.

According to an embodiment, when the diameter ratio (d/D) ranges from 0.90 to 0.94, the uniformity of light that is diffused by the diffusion lens 100 and that reaches a diffusion plate may be best. This may correspond to the fact that the luminance at the peak point by the specified light source in FIG. 6 is lowest when the diameter ratio (d/D) ranges from 0.90 to 0.94.

Accordingly, when the ratio of the diameter of the patterned region 140a to the diameter of the bottom surface 140 ranges from 0.90 to 0.94, the diffusion lens 100 may uniformly improve the distribution of light that reaches the diffusion plate (e.g., the diffusion plate 20 of FIG. 1).

Figure 9:
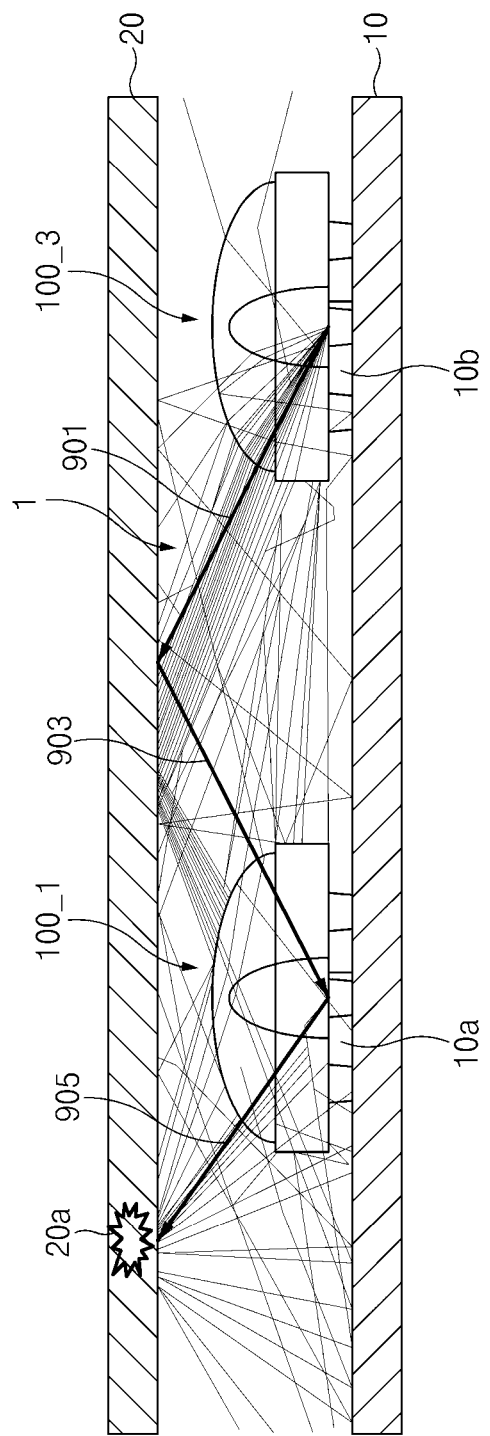
FIG. 9 is a view illustrating a light bounce phenomenon caused by patterns formed on bottom surfaces of diffusion lenses according to various embodiments.

FIG. 9 is a view illustrating a light bounce phenomenon caused by patterns formed on bottom surfaces of diffusion lenses according to various embodiments.

Referring to FIG. 9, a first diffusion lens 100_1 and a second diffusion lens 100_3 may be disposed on a first light emitting element 10a and a second light emitting element 10b, respectively, which are arranged adjacent to each other on a PCB 10.

According to an embodiment, light output from the second diffusion lens 100_3 may be emitted along a first path 901 and may be reflected by a diffusion plate 20 along a second path 903, and the reflected light may be reflected again by a bottom surface (e.g., the bottom surface 140 of FIG. 1) of the first diffusion lens 100_1 along a third path 905. In other words, light output from the second light emitting element 10b through the second diffusion lens 100_3 may be output again through the diffusion plate 20 and the first diffusion lens 100_1. Accordingly, light output from the first diffusion lens 100_1 may include not only light directly generated from the first light emitting element 10a but also part of the light output from the adjacent first diffusion lens 100_1. According to an embodiment, the light output from the first diffusion lens 100_1 may cause a light bounce phenomenon at a first point 20a of the diffusion plate 20 due to an influence of the light output from the adjacent second diffusion lens 100_3.

According to an embodiment, when the second diffusion lens 100_3 has a pattern, the light output again from the first diffusion lens 100_1 may be decreased. In other words, an influence of the light output from the adjacent second diffusion lens 100_3 on the light output from the first diffusion lens 100_1 may be minimized. Accordingly, the light bounce phenomenon occurring at the first point 20a of the diffusion plate 20 may be reduced.

Figure 10:
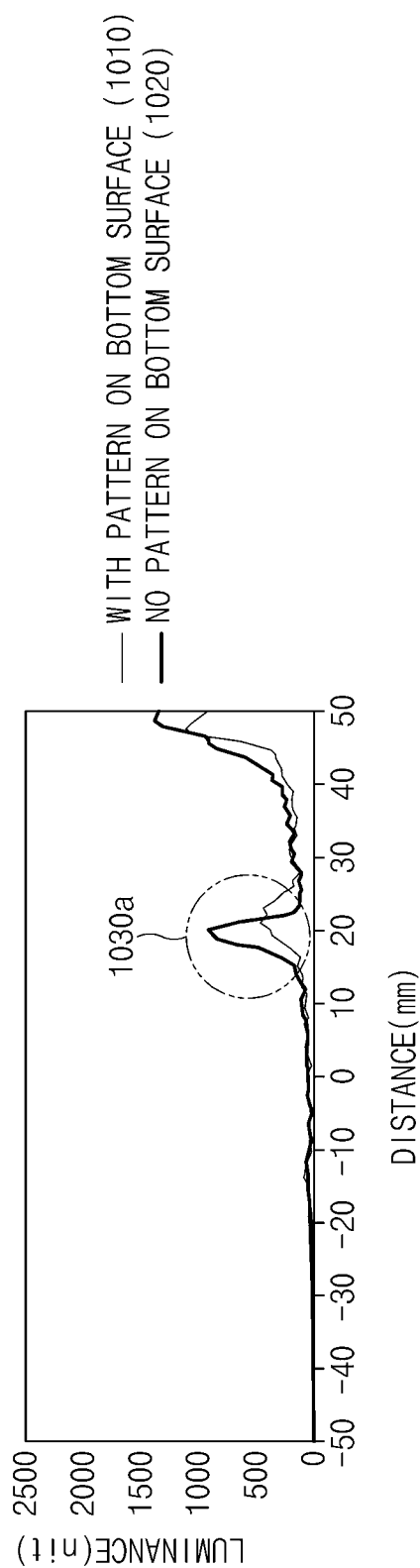
FIG. 10 is a graph depicting a reduction of a light bounce phenomenon by a pattern formed on the bottom surface of the diffusion lens according to various embodiments.

FIG. 10 is a graph depicting a reduction of a light bounce phenomenon by a pattern formed on the bottom surface of the diffusion lens according to various embodiments.

Referring to FIG. 10, the light bounce phenomenon may be reduced by the pattern formed on the bottom surface (e.g., the bottom surface 140 of FIG. 1) of the diffusion lens 100.

According to an embodiment, when a plurality of diffusion lenses have patterns on bottom surfaces thereof (1010), luminance at a specified point of a diffusion plate (e.g., the diffusion plate 20 of FIG. 1) may be lowered (1030a), as compared with when the plurality of diffusion lenses have no patterns (1020). In other words, a light bounce phenomenon occurring at the specified point of the diffusion plate may be reduced. The specified point may correspond to the first point 20a of FIG. 10.

Figure 11A:
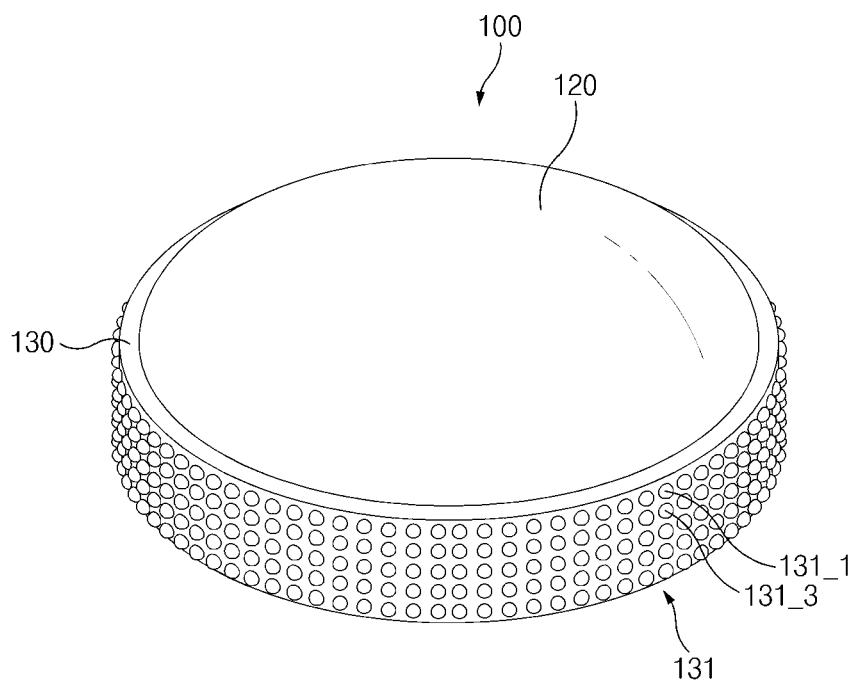
FIGS. 11 to 13 are views illustrating patterns in which specified shapes are regularly arranged and that are formed on the side surface of the diffusion lens according to an embodiment.
Figure 11B:
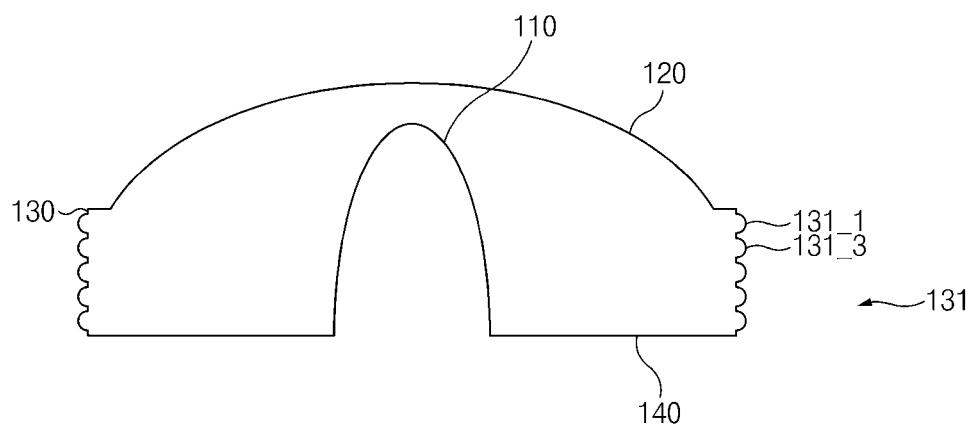
Figure 12A:
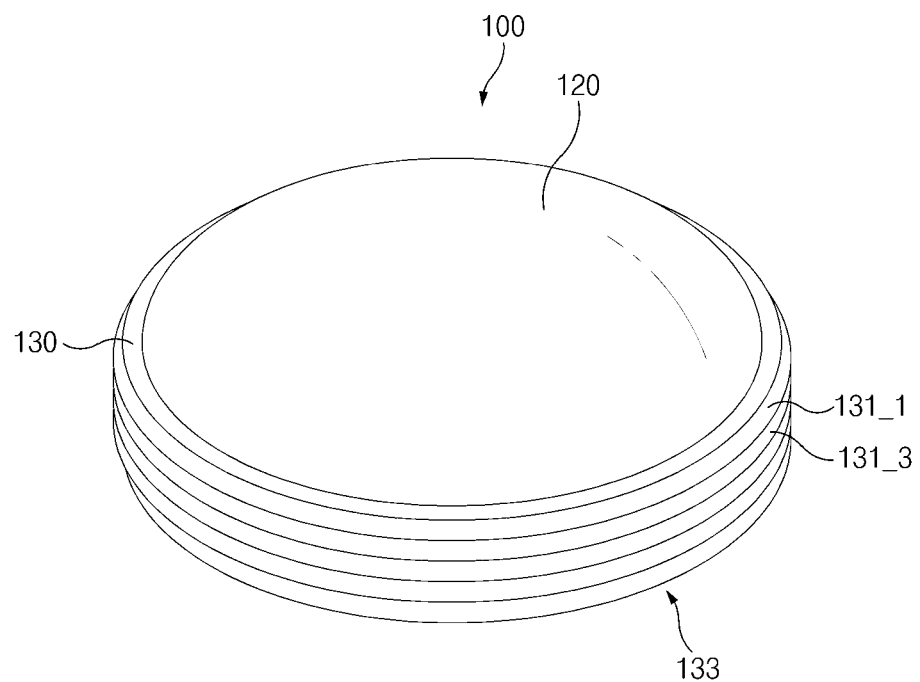
Figure 12B:
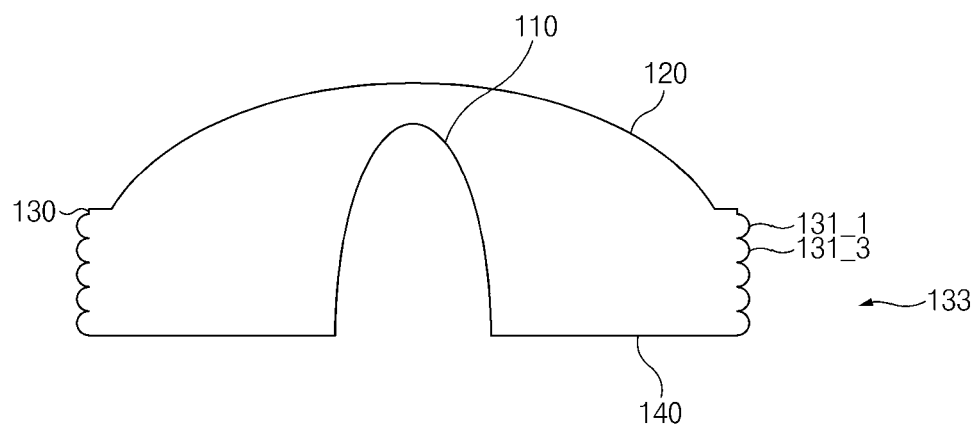
Figure 13A:
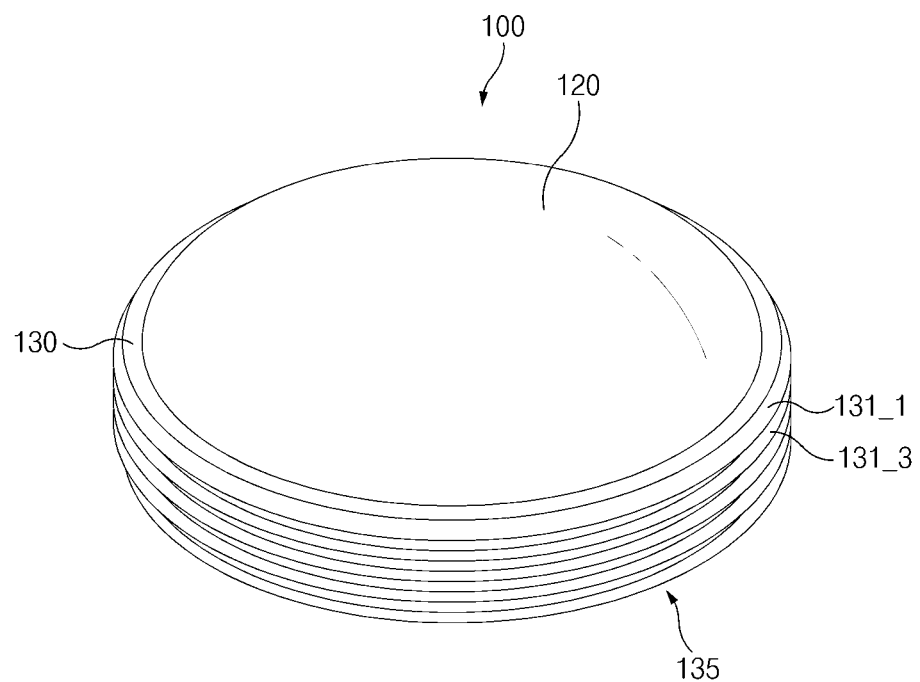
Figure 13B:
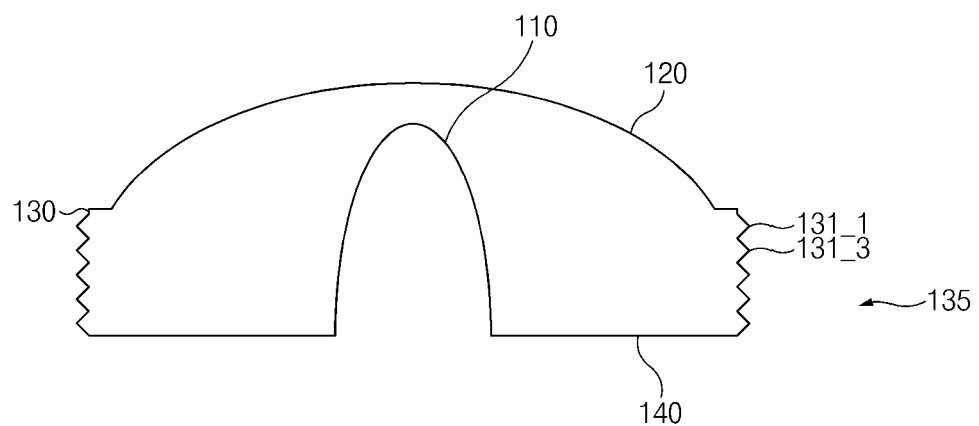

FIGS. 11 to 13 are views illustrating patterns in which specified shapes are regularly arranged and that are formed on the side surface of the diffusion lens according to an embodiment.

Referring to FIG. 11, a plurality of hemisphere shapes (or, circular protrusion shapes) 131 may be regularly arranged on the side surface 130 of the diffusion lens 100. (a) is a perspective view of the diffusion lens 100, and (b) is a sectional view of the diffusion lens 100.

According to an embodiment, the plurality of hemisphere shapes 131 formed on the side surface 130 of the diffusion lens 100 may be disposed with a specified distance therebetween. Hemisphere shapes 131_1 and 131_3 included in the plurality of hemisphere shapes 131 may be identical to each other.

According to an embodiment, light incident through the first lens surface 110 and light reflected by the second lens surface 120 and the bottom surface 140 may be output through the side surface 130 on which the plurality of hemisphere shapes 131 are regularly disposed.

Referring to FIG. 12, a plurality of semicircular tube shapes 133 may be regularly arranged on the side surface 130 of the diffusion lens 100. Semicircular tube shapes 133_1 and 133_3 may be shapes formed by extending semicircles. (a) is a perspective view of the diffusion lens 100, and (b) is a sectional view of the diffusion lens 100.

According to an embodiment, the plurality of semicircular tube shapes 133 formed on the side surface 130 of the diffusion lens 100 may be continuously disposed in the vertical direction. The semicircular tube shapes 133_1 and 133_3 included in the plurality of semicircular tube shapes 133 may be identical to each other.

According to an embodiment, light incident through the first lens surface 110 and light reflected by the second lens surface 120 and the bottom surface 140 may be output through the side surface 130 on which the plurality of semicircular tube shapes 133 are regularly disposed.

Referring to FIG. 13, a plurality of triangular tube shapes 135 may be regularly arranged on the side surface 130 of the diffusion lens 100. Triangular tube shapes 135_1 and 135_3 may be shapes formed by extending triangles. (a) is a perspective view of the diffusion lens 100, and (b) is a sectional view of the diffusion lens 100.

According to an embodiment, the plurality of triangular tube shapes 135 formed on the side surface 1300 of the diffusion lens 100 may be continuously disposed in the vertical direction. The triangular tube shapes 135_1 and 135_3 included in the plurality of triangular tube shapes 135 may be identical to each other.

According to an embodiment, light incident through the first lens surface 110 and light reflected by the second lens surface 120 and the bottom surface 140 may be output through the side surface 130 on which the plurality of triangular tube shapes 135 are regularly disposed.

Figure 14:
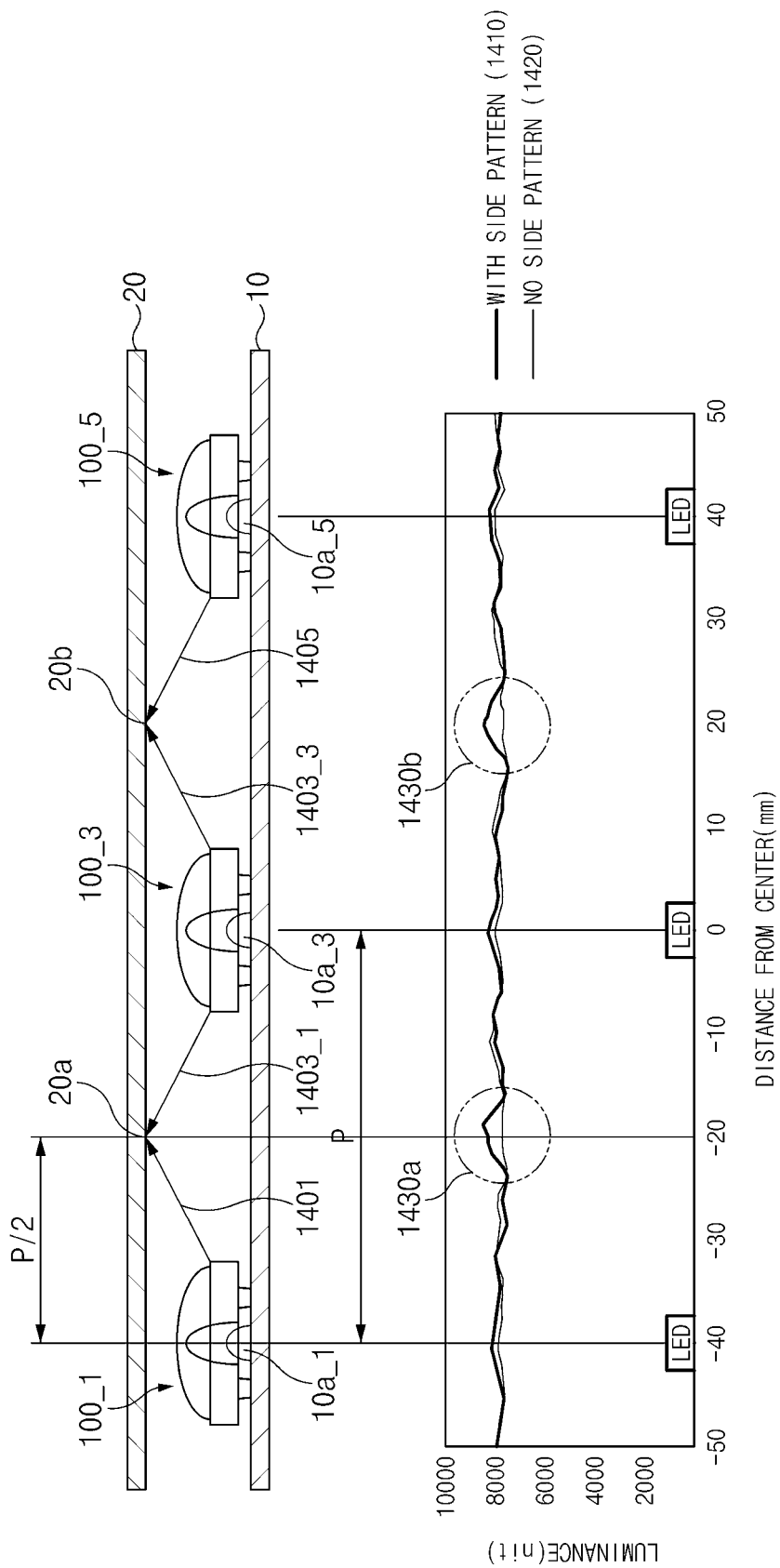
FIG. 14 is a view illustrating a reduction of a light bounce phenomenon by patterns formed on side surfaces of diffusion lenses according to various embodiments.

FIG. 14 is a view illustrating a reduction of a light bounce phenomenon by patterns formed on side surfaces of diffusion lenses according to various embodiments.

Referring to FIG. 14, a first diffusion lens 100_1, a second diffusion lens 100_3, and a third diffusion lens 100_5 may be disposed on a first light emitting element 10a, a second light emitting element 10b, and a third light emitting element 10c, respectively, which are arranged on a PCB 10 at specified intervals P.

According to an embodiment, a light bounce phenomenon may occur at a first point 20a of a diffusion plate 20 by first light 1401 output from a side surface of the first diffusion lens 100_1 and second light 1403_1 output from a side surface of the second diffusion lens 100_3. For example, the first point 20a may be a point spaced apart from the first light emitting element (or, the second light emitting element 10b) by a distance of 1/P that is a half of the specified interval P. According to an embodiment, a light bounce phenomenon may occur at a second point 20b of the diffusion plate 20 by third light 1403_3 output from the side surface of the second diffusion lens 100_3 and fourth light 1405 output from a side surface of the third diffusion lens 100_5. For example, the second point 20b may be a point spaced apart from the second light emitting element 10b (or, the third light emitting element 10c) by a distance of P/2 that is a half of the specified interval P.

According to an embodiment, when the plurality of diffusion lenses have patterns on the side surfaces thereof (1410), luminance at the first point 20a and the second point 20b may be lowered (1430a and 1430b), as compared with when the plurality of diffusion lenses have no patterns (1420). In other words, the light bounce phenomena occurring at the first point 20a and the second point 20b of the diffusion plate 20 may be reduced.

Figures 15A, 15B:
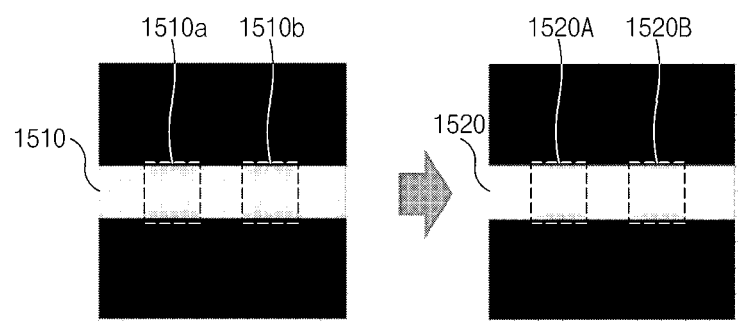
FIG. 15 is a distribution diagram illustrating the amount of light reaching a diffusion plate through the diffusion lens according to various embodiments.

FIG. 15 is a distribution diagram illustrating the amount of light reaching a diffusion plate through the diffusion lens according to various embodiments.

Referring to FIG. 15, a light bounce phenomenon may be reduced by a pattern formed on the side surface of the diffusion lens 100.

Referring to (a), when no pattern is formed on the side surface of the diffusion lens 100, a distribution diagram 1510 of light reaching the diffusion plate may include a first portion 1510a and a second portion 1510b where a relatively large amount of light is distributed. The first portion 1510a and the second portion 1510b may correspond to regions containing the first point 20a and the second point 20b of the diffusion plate 20 of FIG. 14. According to an embodiment, due to a light bounce phenomenon, a large amount of light may be distributed in the first portion 1510a and the second portion 1510b. Accordingly, luminance unevenness may appear in regions corresponding to the first portion 1510a and the second portion 1510b of the diffusion plate.

Referring to (b), when a pattern is formed on the side surface of the diffusion lens 100, a distribution diagram 1520 of light reaching the diffusion plate may include a third portion 1520a and a fourth portion 1510b where light is distributed as in other regions. The third portion 1520a and the fourth portion 1520 may correspond to the first portion 1510a and the second portion 1510b. According to an embodiment, due to a reduction of a light bounce phenomenon, light may be distributed in the third portion 1520a and the fourth portion 1520b as in the other regions. Accordingly, luminance unevenness may be reduced in regions corresponding to the third portion 1520a and the fourth portion 1520b of the diffusion plate.

Figure 16:
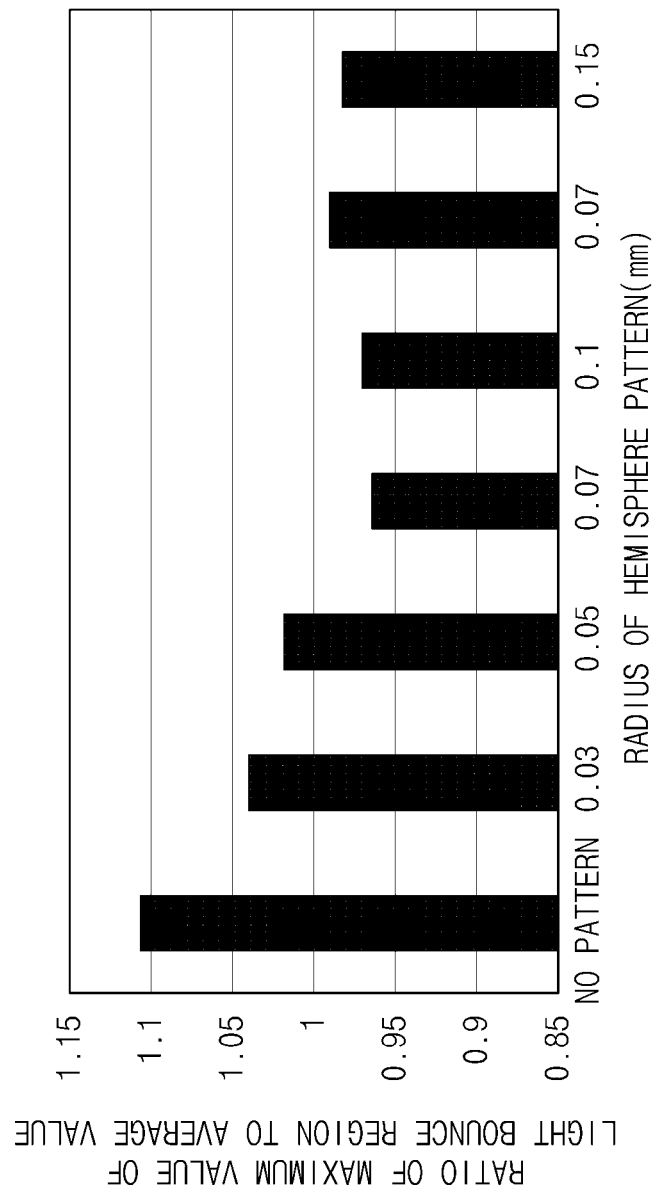
FIG. 16 is a graph depicting relative luminance of a light bounce phenomenon occurrence region depending on the radius of hemisphere shapes formed on the side surface of the diffusion lens according to an embodiment.

FIG. 16 is a graph depicting relative luminance of a light bounce phenomenon occurrence region depending on the radius of hemisphere shapes formed on the side surface of the diffusion lens according to an embodiment.

Referring to FIG. 16, a plurality of hemisphere shapes having a specified diameter may be formed on the side surface of the diffusion lens 100 as in FIG. 9.

According to an embodiment, the relative luminance of the light bounce phenomenon occurrence region may be expressed as the luminance ratio between the maximum luminance value of the light bounce phenomenon occurrence region and the average luminance value of light reaching a diffusion plate.

According to an embodiment, the luminance ratio between the maximum luminance value of the light bounce phenomenon occurrence region and the average luminance value of light reaching the diffusion plate may be measured depending on the radius "R" of the hemisphere shapes formed on the side surface of the diffusion lens 100. Accordingly, the measured luminance ratio may represent the uniformity of light reaching the diffusion plate.

According to an embodiment, when the diffusion lens 100 has, on the side surface thereof, a pattern in which a plurality of hemisphere shapes are regularly arranged, the luminance ratio may be lowered to 1, as compared with when the diffusion lens 100 does not have the pattern. Furthermore, the luminance ratio by a specified light source may have a value close to 1 when the radius of the hemisphere shapes ranges from 0.05 mm to 0.15 mm. Accordingly, when the radius of the hemisphere shapes ranges from 0.05 mm to 0.15 mm, the distribution of light reaching the diffusion plate may be relatively uniformly improved.

Figure 17:
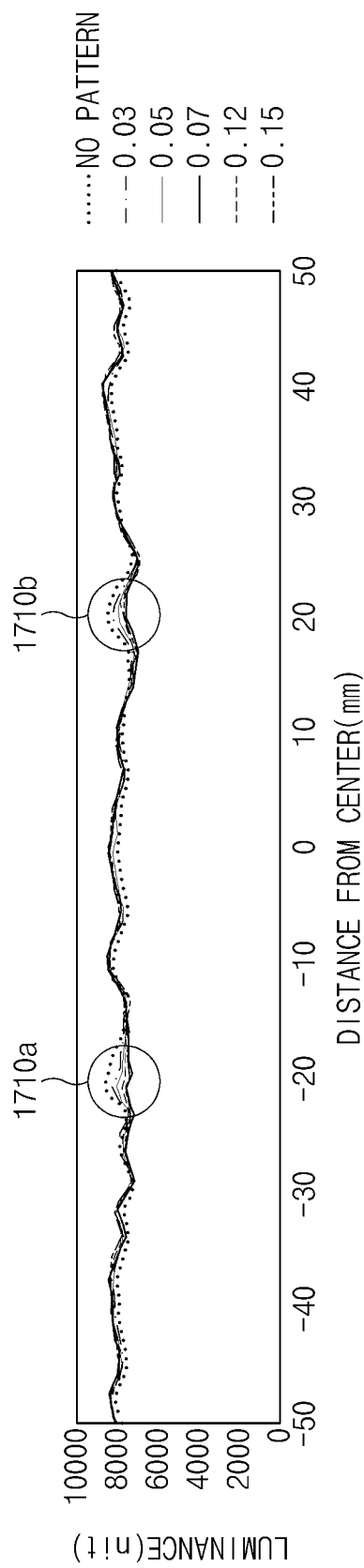
FIG. 17 is a graph depicting luminance distribution depending on the radius of the hemisphere shapes formed on the side surface of the diffusion lens according to an embodiment.

FIG. 17 is a graph depicting luminance distribution depending on the radius of the hemisphere shapes formed on the side surface of the diffusion lens according to an embodiment.

Referring to FIG. 17, luminance may be measured when the radius of the hemisphere shapes in FIG. 16 ranges from 0.03 mm to 0.15 mm.

According to an embodiment, when the diffusion lens 100 has, on the side surface thereof, the pattern in which the plurality of hemisphere shapes are arranged, luminance in a region where a light bounce phenomenon occurs may be lowered (1710a and 1710b). Furthermore, when the radius of the hemisphere shapes ranges from 0.05 mm to 0.15 mm, the uniformity of light that is diffused by the diffusion lens 100 and that reaches a diffusion plate may be best. This may correspond to the fact that the luminance ratio between the maximum luminance value of the light bounce phenomenon occurrence region and the average luminance value of light reaching the diffusion plate in FIG. 16 converges to 1 when the radius of the hemisphere shapes ranges from 0.05 to 0.15.

Figures 18A, 18B:
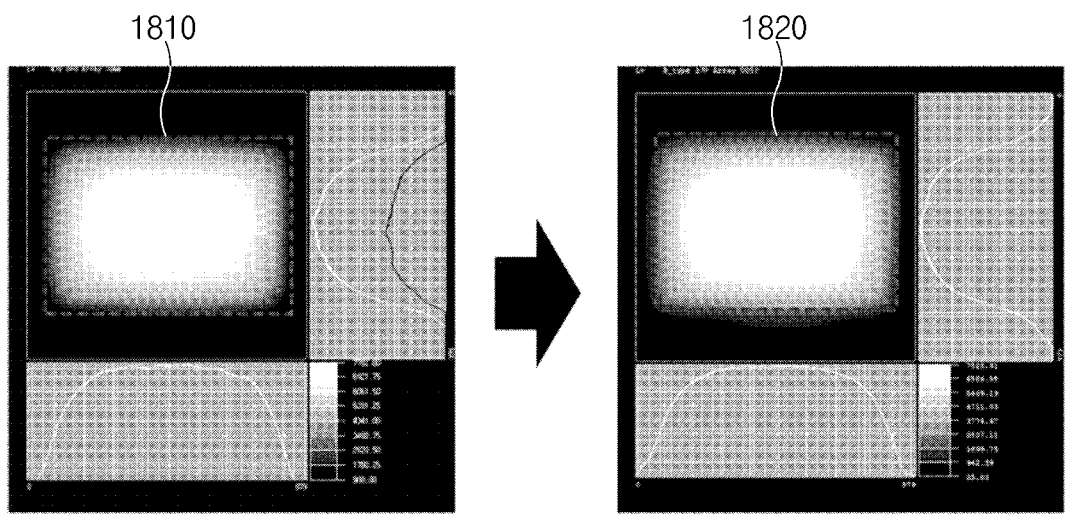
FIG. 18 is a distribution diagram illustrating the amount of light reaching a diffusion plate by patterns formed on the side surface and the bottom surface of the diffusion lens according to various embodiments.

FIG. 18 is a distribution diagram illustrating the amount of light reaching a diffusion plate by patterns formed on the side surface and the bottom surface of the diffusion lens according to various embodiments.

Referring to FIG. 18, the distribution of light reaching the diffusion plate may be uniformly improved by the patterns formed on the side surface and the bottom surface of the diffusion lens 100.

Referring to (a), when no pattern is formed on the diffusion lens 100, a relatively large amount of light may be distributed in a specified region in a distribution diagram 1810 of light reaching the diffusion plate. According to an embodiment, a light bounce phenomenon may occur in the specified region. Accordingly, the uniformity of light reaching the diffusion plate may be low. In other words, luminance unevenness may be included in the diffusion plate.

Referring to (b), when the diffusion lens 100 has the patterns formed on the side surface and the bottom surface thereof, light may be similarly distributed in the entire region in a distribution diagram 1820 of light reaching the diffusion plate. According to an embodiment, the light bounce phenomenon in the specified region may be reduced. Accordingly, the uniformity of light reaching the diffusion plate may be high. In other words, the luminance unevenness in the diffusion plate may be reduced.

Figure 19:
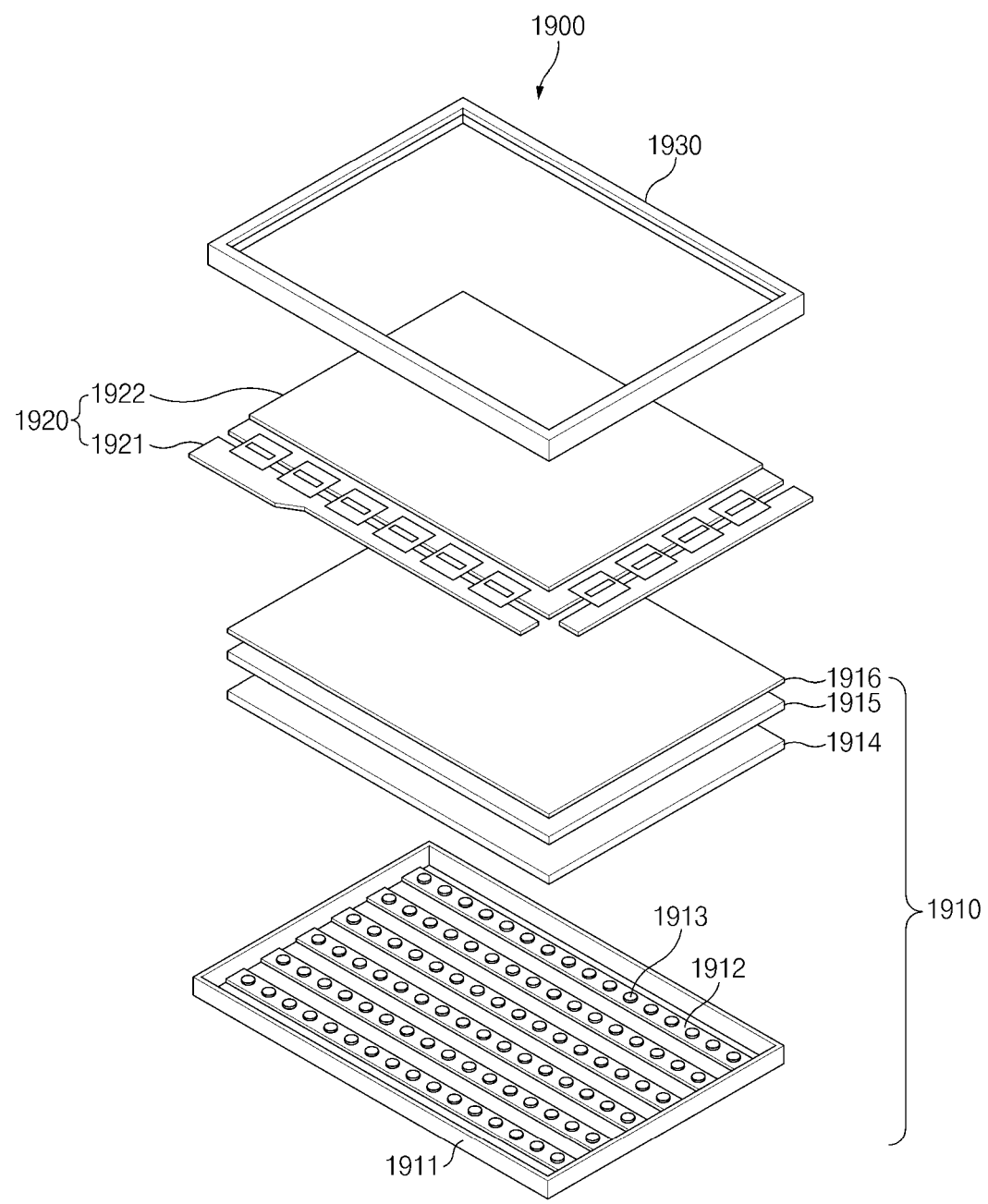
FIG. 19 is a view illustrating a configuration of a display device including diffusion lenses according to various embodiments.

FIG. 19 is a view illustrating a configuration of a display device including diffusion lenses according to various embodiments.

Referring to FIG. 19, the display device 1900 may include a backlight panel 1910, a display panel 1920, and a bezel 1930.

According to an embodiment, the backlight panel may include a receiving container 1911, a first PCB 1912, diffusion lenses 1913, a light guide plate 1914, a diffusion plate 1915, and an optical sheet 1916.

According to an embodiment, the receiving container 1911 may receive the first PCB 1912 therein. According to an embodiment, a plurality of light emitting elements may be arranged at specified intervals on the first PCB 1912. The first PCB 1912 may be the same as the PCB 10 of FIG. 1. The light emitting elements may be, for example, light emitting diodes. According to an embodiment, the diffusion lenses 1913 may be disposed on the plurality of light emitting elements, respectively. The diffusion lenses 1913 may be, for example, lenses that are the same as the diffusion lens 100 of FIG. 1.

According to an embodiment, the light guide plate 1914 may be spaced apart from the light emitting elements. The light guide plate 1914 may mix red light, blue light, and green light included in light generated from the light emitting elements and may output the mixed light. According to an embodiment, the light guide plate 1914 may be formed of poly methyl methacrylate (PMMA). According to an embodiment, the diffusion plate 1915 may diffuse the light output through the light guide plate 1914. According to an embodiment, the diffusion plate 1915 may be formed of poly methyl methacrylate (PMMA) and may contain a diffusing agent for diffusion of light. The diffusion plate 1915 may be the same as the diffusion plate 20 of FIG. 1. According to an embodiment, the optical sheet 1916 may change the path of the light diffused through the diffusion plate 1915, thereby improving luminance characteristics of the light. According to an embodiment, the optical sheet 1916 may be a light-condensing sheet for improving front luminance of light.

According to an embodiment, the display panel 1920 may display an image. According to an embodiment, the display panel 1920 may be a liquid crystal display panel. The display panel 1920 may include, for example, a substrate 1921 on which thin film transistors (TFTs), which are switching elements, are formed in a matrix form and a color filter substrate 1922 on which RGB pixels for implementing colors are formed in a thin film form.

According to an embodiment, the bezel 1930 may couple the backlight panel 1910 to the display panel 1920. According to an embodiment, the bezel 1930 may be coupled with the receiving container 1911 of the backlight panel 1910 to form a housing of the display device 1900.

The diffusion lens 100 according to the various embodiments of the disclosure, which has been described above with reference to FIGS. 1 to 19, may have the second lens surface 120 formed such that there is no inflection point in the rate of change of curvature, thereby achieving a high production yield and an excellent assembly tolerance and uniformly improving light distribution in the diffusion plate 20 even when the distance between the light source element 10*a* and the diffusion plate 20 is short. Furthermore, the diffusion lens 100 may have, on the side surface and the bottom surface thereof, the pattern in which the arbitrary shapes or the specified shapes are regularly or irregularly disposed and may diffuse light generated from the light emitting element to other regions, thereby more uniformly improving the distribution of light reaching the diffusion plate.

In addition, the display device 1900 having the diffusion lens 100 installed therein may maintain the luminance of light in the diffusion plate 1915 of the backlight panel 1910 at a specified value or more by using a small number of light emitting elements, thereby reducing manufacturing costs of the display device 1900.

Figure 20:
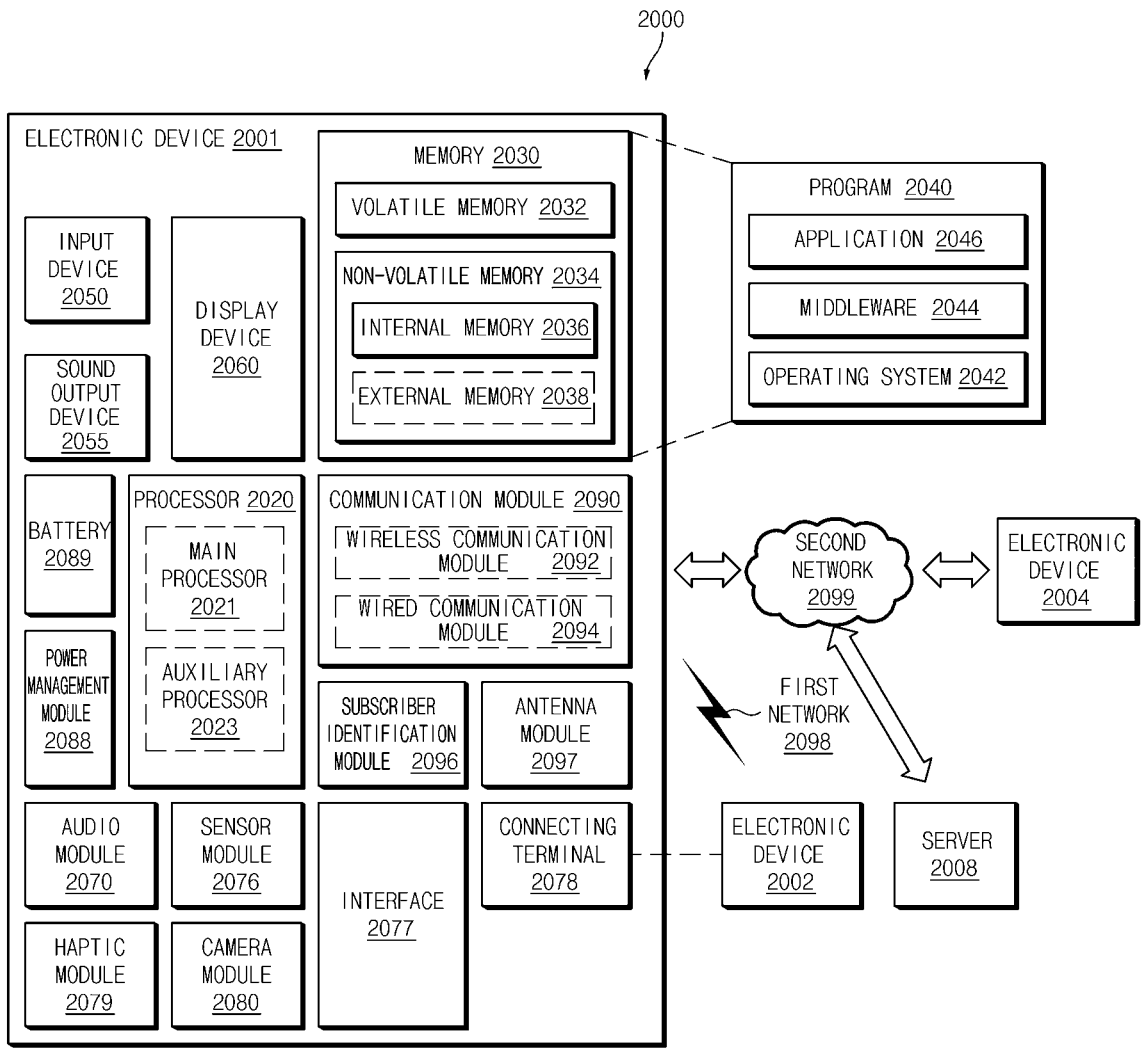
FIG. 20 is a block diagram of an electronic device in a network environment according to various embodiments.

FIG. 20 is a block diagram illustrating an electronic device 2001 in a network environment 2000 according to various embodiments.

Referring to FIG. 20, the electronic device 2001 in the network environment 2000 may communicate with an electronic device 2002 via a first network 2098 (e.g., a short-range wireless communication network), or an electronic device 2004 or a server 2008 via a second network 2099 (e.g., a long-range wireless communication network). According to an embodiment, the electronic device 2001 may communicate with the electronic device 2004 via the server 2008. According to an embodiment, the electronic device 2001 may include a processor 2020, a memory 2030, an input device 2050, a sound output device 2055, a display device 2060 (e.g., the display device 1900 of FIG. 19), an audio module 2070, a sensor module 2076, an interface 2077, a haptic module 2079, a camera module 2080, a power management module 2088, a battery 2089, a communication module 2090, a subscriber identification module (SIM) 2096, or an antenna module 2097. In some embodiments, at least one (e.g., the display device 2060 or the camera module 2080) of the components may be omitted from the electronic device 2001, or one or more other components may be added in the electronic device 2001. In some embodiments, some of the components may be implemented as single integrated circuitry. For example, the sensor module 2076 (e.g., a fingerprint sensor, an iris sensor, or an illuminance sensor) may be implemented as embedded in the display device 2060 (e.g., a display).

The processor 2020 may execute, for example, software (e.g., a program 2040) to control at least one other component (e.g., a hardware or software component) of the electronic device 2001 coupled with the processor 2020, and may perform various data processing or computation. According to one embodiment, as at least part of the data processing or computation, the processor 2020 may load a command or data received from another component (e.g., the sensor module 2076 or the communication module 2090) in a volatile memory 2032, process the command or the data stored in the volatile memory 2032, and store resulting data in a non-volatile memory 2034. According to an embodiment, the processor 2020 may include a main processor 2021 (e.g., a central processing unit (CPU) or an application processor (AP)), and an auxiliary processor 2023 (e.g., a graphics processing unit (GPU), an image signal processor (ISP), a sensor hub processor, or a communication processor (CP)) that is operable independently from, or in conjunction with, the main processor 2021. Additionally or alternatively, the auxiliary processor 2023 may be adapted to consume less power than the main processor 2021, or to be specific to a specified function. The auxiliary processor 2023 may be implemented as separate from, or as part of the main processor 2021.

The auxiliary processor 2023 may control at least some of functions or states related to at least one component (e.g., the display device 2060, the sensor module 2076, or the communication module 2090) among the components of the electronic device 2001, instead of the main processor 2021 while the main processor 2021 is in an inactive (e.g., sleep) state, or together with the main processor 2021 while the main processor 2021 is in an active state (e.g., executing an application). According to an embodiment, the auxiliary processor 2023 (e.g., an image signal processor or a communication processor) may be implemented as part of another component (e.g., the camera module 2080 or the communication module 2090) functionally related to the auxiliary processor 2023.

The memory 2030 may store various data used by at least one component (e.g., the processor 2020 or the sensor module 2076) of the electronic device 2001. The various data may include, for example, software (e.g., the program 2040) and input data or output data for a command related thereto. The memory 2030 may include the volatile memory 2032 or the non-volatile memory 2034.

The program 2040 may be stored in the memory 2030 as software, and may include, for example, an operating system (OS) 2042, middleware 2044, or an application 2046.

The input device 2050 may receive a command or data to be used by other component (e.g., the processor 2020) of the electronic device 2001, from the outside (e.g., a user) of the electronic device 2001. The input device 2050 may include, for example, a microphone, a mouse, or a keyboard.

The sound output device 2055 may output sound signals to the outside of the electronic device 2001. The sound output device 2055 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 2060 may visually provide information to the outside (e.g., a user) of the electronic device 2001. The display device 2060 may include, for example, a display, a hologram device, or a projector and control circuitry to control a corresponding one of the display, hologram device, and projector. According to an embodiment, the display device 2060 may include touch circuitry adapted to detect a touch, or sensor circuitry (e.g., a pressure sensor) adapted to measure the intensity of force incurred by the touch.

The audio module 2070 may convert a sound into an electrical signal and vice versa. According to an embodiment, the audio module 2070 may obtain the sound via the input device 2050, or output the sound via the sound output device 2055 or an external electronic device (e.g., an electronic device 2002) (e.g., speaker of headphone) directly (e.g., wiredly) or wirelessly coupled with the electronic device 2001.

The sensor module 2076 may detect an operational state (e.g., power or temperature) of the electronic device 2001 or an environmental state (e.g., a state of a user) external to the electronic device 2001, and then generate an electrical signal or data value corresponding to the detected state. According to an embodiment, the sensor module 2076 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 2077 may support one or more specified protocols to be used for the electronic device 2001 to be coupled with the external electronic device (e.g., the electronic device 2002) directly (e.g., wiredly) or wirelessly. According to an embodiment, the interface 2077 may include, for example, a high definition multimedia interface (HDMI), a universal serial bus (USB) interface, a secure digital (SD) card interface, or an audio interface.

A connecting terminal 2078 may include a connector via which the electronic device 2001 may be physically connected with the external electronic device (e.g., the electronic device 2002). According to an embodiment, the connecting terminal 2078 may include, for example, a HDMI connector, a USB connector, a SD card connector, or an audio connector (e.g., a headphone connector).

The haptic module 2079 may convert an electrical signal into a mechanical stimulus (e.g., a vibration or a movement) or electrical stimulus which may be recognized by a user via his tactile sensation or kinesthetic sensation. According to an embodiment, the haptic module 2079 may include, for example, a motor, a piezoelectric element, or an electric stimulator.

The camera module 2080 may capture a still image or moving images. According to an embodiment, the camera module 2080 may include one or more lenses, image sensors, image signal processors, or flashes.

The power management module 2088 may manage power supplied to the electronic device 2001. According to one embodiment, the power management module 388 may be implemented as at least part of, for example, a power management integrated circuit (PMIC).

The battery 2089 may supply power to at least one component of the electronic device 2001. According to an embodiment, the battery 2089 may include, for example, a primary cell which is not rechargeable, a secondary cell which is rechargeable, or a fuel cell.

The communication module 2090 may support establishing a direct (e.g., wired) communication channel or a wireless communication channel between the electronic device 2001 and the external electronic device (e.g., the electronic device 2002, the electronic device 2004, or the server 2008) and performing communication via the established communication channel. The communication module 2090 may include one or more communication processors that are operable independently from the processor 2020 (e.g., the application processor (AP)) and supports a direct (e.g., wired) communication or a wireless communication. According to an embodiment, the communication module 2090 may include a wireless communication module 2092 (e.g., a cellular communication module, a short-range wireless communication module, or a global navigation satellite system (GNSS) communication module) or a wired communication module 2094 (e.g., a local area network (LAN) communication module or a power line communication (PLC) module). A corresponding one of these communication modules may communicate with the external electronic device via the first network 2098 (e.g., a short-range communication network, such as Bluetooth™, wireless-fidelity (Wi-Fi) direct, or infrared data association (IrDA)) or the second network 2099 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 2092 may identify and authenticate the electronic device 2001 in a communication network, such as the first network 2098 or the second network 2099, using subscriber information (e.g., international mobile subscriber identity (IMSI)) stored in the subscriber identification module 2096.

The antenna module 2097 may transmit or receive a signal or power to or from the outside (e.g., the external electronic device). According to an embodiment, the antenna module may be formed as a conductive material or a conductive pattern. According to another embodiment, the antenna module may additionally include another component (e.g., a radio frequency integrated circuit (RFIC)) other than the conductive material or the conductive pattern. According to an embodiment, the antenna module 2097 may include a plurality of antennas. In such a case, at least one antenna appropriate for a communication scheme used in the communication network, such as the first network 2098 or the second network 2099, may be selected, for example, by the communication module 2090 from the plurality of antennas. The signal or the power may then be transmitted or received between the communication module 2090 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 2001 and the external electronic device 2004 via the server 2008 coupled with the second network 2099. Each of the electronic devices 2002 and 2004 may be a device of a same type as, or a different type, from the electronic device 2001. According to an embodiment, all or some of operations to be executed at the electronic device 2001 may be executed at one or more of the external electronic devices 2002, 2004, or 2008. For example, when the electronic device 2001 should perform a function or a service automatically, or in response to a request from a user or another device, the electronic device 2001, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 2001. The electronic device 2001 may provide the outcome, with or without further processing of the outcome, as at least part of a reply to the request. To that end, a cloud computing, distributed computing, or client-server computing technology may be used, for example.

Figure 21:
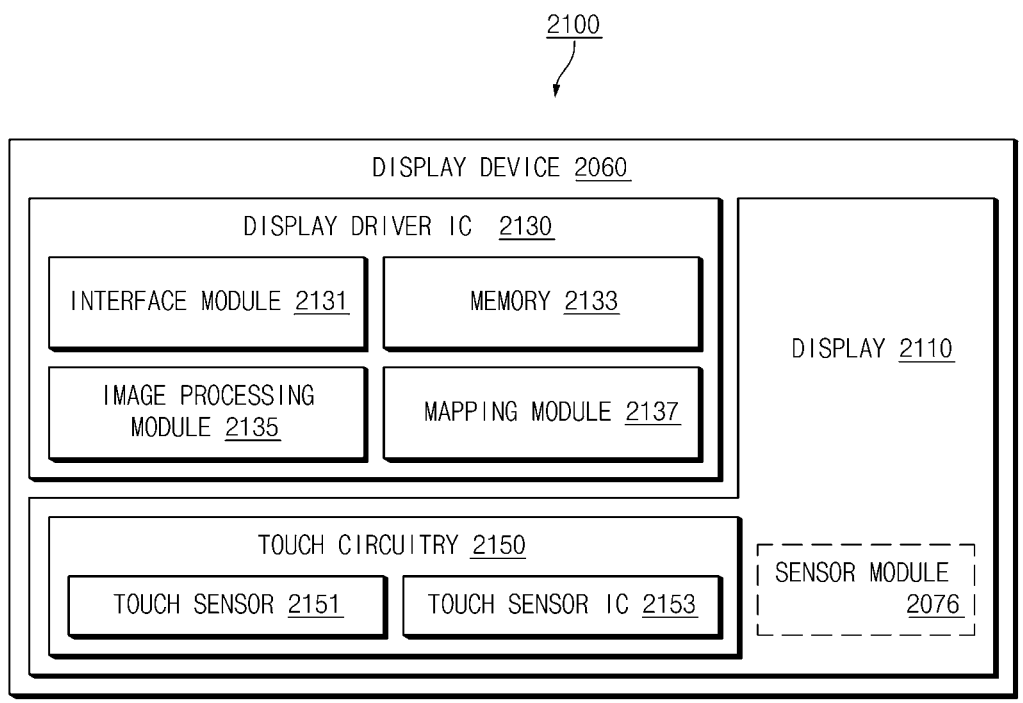
FIG. 21 is a block diagram of a display device according to various embodiments.

FIG. 21 is a block diagram 2100 of the display device 2060 according to various embodiments.

Referring to FIG. 21, the display device 2060 may include a display 2110 and a display driver IC (DDI) 2130 for controlling the display 2110. The DDI 2130 may include an interface module 2131, a memory 2133 (e.g., a buffer memory), an image processing module 2135, or a mapping module 2137. The DDI 2130 may receive, for example, image data or image information including an image control signal corresponding to an instruction for controlling the image data, from another component of the electronic device 2001 through the interface module 2131. For example, according to an embodiment, the image information may be received from the processor 2020 (e.g., the main processor 2021 (e.g., an application processor) or the auxiliary processor 2023 (e.g., a graphic processing device) that operates independently of a function of the main processor 2021). The DDI 2130 may communicate with touch circuitry 2150 or the sensor module 2076 through the interface module 2131. Furthermore, the DDI 2130 may store at least part of the received image information in the memory 2133, for example, on a frame-by-frame basis. The image processing module 2135, for example, may perform pre-processing or post-processing (e.g., adjustment of the resolution, brightness, or size) on at least part of the image data, based at least on characteristics of the image data or characteristics of the display 2110. The mapping module 2137 may generate a voltage value or a current value that corresponds to the image data pre-processed or post-processed through the image processing module 2035. According to an embodiment, the generation of the voltage value or the current value may be performed based at least partly on, for example, attributes of pixels of the display 2110 (e.g., an arrangement of the pixels (an RGB stripe or a pentile structure) or the size of each of sub-pixels). At least some pixels of the display 2110 may be driven based at least partly on, for example, the voltage value or the current value, and visual information (e.g., text, an image, or an icon) that corresponds to the image data may be displayed through the display 2110.

According to an embodiment, the display device 2060 may further include the touch circuitry 2150. The touch circuitry 2150 may include a touch sensor 2151 and a touch sensor IC 2153 for controlling the touch sensor 2151. The touch sensor IC 2153 may control the touch sensor 2151 to detect, for example, a touch input or a hovering input to a specific position of the display 2110. For example, the touch sensor IC 2153 may detect the touch input or the hovering input by measuring a change of a signal (e.g., voltage, an amount of light, resistance, or an amount of electric charge) for the specific position of the display 2110. The touch sensor IC 2153 may provide information (e.g., position, area, pressure, or time) regarding the detected touch input or hovering input to the processor 2020. According to an embodiment, at least a part (e.g., the touch sensor IC 2153) of the touch circuitry 2150 may be included as a part of the display driver IC 2130 or the display 2110 or a part of another component (e.g., the auxiliary processor 2023) disposed outside the display device 2060.

According to an embodiment, the display device 2060 may further include at least one sensor (e.g., a fingerprint sensor, an iris sensor, a pressure sensor, or an illuminance sensor) of the sensor module 2076, or control circuitry for the at least one sensor. In this case, the at least one sensor or the control circuitry for the same may be embedded in a part (e.g., the display 2110 or the DDI 2130) of the display device 2060 or a part of the touch circuitry 2150. For example, when the sensor module 2076 embedded in the display device 2060 includes a biosensor (e.g., a fingerprint sensor), the biosensor may obtain biometric information (e.g., a fingerprint image) associated with a touch input, through a partial area of the display 2110. In another example, when the sensor module 2076 embedded in the display device 2060 includes a pressure sensor, the pressure sensor may obtain pressure information associated with a touch input, through all or part of the display 2110. According to an embodiment, the touch sensor 2151 or the sensor module 2076 may be disposed between pixels in a pixel layer of the display 2110 or over or under the pixel layer. The electronic device according to the various embodiments disclosed herein may include various forms of devices. The electronic device may include, for example, a portable communication device (e.g., a smartphone), a computer device, a portable multimedia device, a portable medical device, a camera, a wearable device, and a home appliance. The electronic device according to the embodiments of the disclosure is not limited to the aforementioned devices.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 2040) including one or more instructions that are stored in a storage medium (e.g., internal memory 2036 or external memory 2038) that is readable by a machine (e.g., the electronic device 2001). For example, a processor (e.g., the processor 2020) of the machine (e.g., the electronic device 2001) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. A diffusion lens comprising:
 a first lens surface having a concave curved shape such that light generated from a light source is incident on the first lens surface;
 a second lens surface having a convex curved shape such that part of the light incident on the first lens surface is output from the second lens surface;
 a side surface extending from a periphery of the second lens surface in a vertical direction of the diffusion lens such that part of a remainder of the light incident on the first lens surface is output from the side surface by passing through the side surface; and a bottom surface extending from a periphery of the first lens surface in a horizontal direction of the diffusion lens to meet a periphery of the side surface, wherein a sign of a rate of change of curvature of the first lens surface is the same as a sign of rate of change of curvature of the second lens surface, wherein a pattern in which arbitrary shapes are irregularly disposed or a pattern in which specified shapes are regularly or irregularly disposed is formed on the side surface and the bottom surface to diffuse the light passing through the side surface and diffuse the light reflected by the bottom surface, wherein in the pattern formed on the side surface, the arbitrary shapes or the specified shapes extend from the periphery of the second lens surface to the periphery of the side surface that meets bottom surface, wherein the pattern on the bottom surface is formed on part of the bottom surface, and wherein a diameter ratio (d/D) between a diameter "d" of a region where the pattern of the bottom surface is formed and a diameter "D" of the bottom surface ranges from 0.90 to 0.94.

2. The diffusion lens of claim 1, wherein the first lens surface and the second lens surface have elliptical vertical sections and are formed according to Equation below, and $A_2$ is not 0 when the second lens surface is formed, $$z(r) = \frac{c*r^2}{1+\sqrt{1-(1-k)*c^2*r^2}} + A_1*r + A_2*r^2 + A_3*r^3 + \ldots + A_n*r^n$$

here, c is a curvature of a lens, k is a conic constant, and $A_1$ to $A_n$ are aspheric coefficients.

3. The diffusion lens of claim 2, wherein the first lens surface has a conic constant $-1 < k_1 < 0$, and wherein the second lens surface has a conic constant $0 < k_2 < 20$.

4. The diffusion lens of claim 2, wherein a curvature $c_1$ of the first lens surface and an effective diameter $D_1$ of the first lens surface have a relation $5 < c_1 * D_1 < 15$, and wherein a curvature $c_2$ of the second lens surface and an effective diameter $D_2$ of the second lens surface have a relation $0.5 < c_2 * D_2 < 2$.

5. The diffusion lens of claim 1, wherein the pattern in which the arbitrary shapes are irregularly arranged is formed by etching the side surface and the bottom surface.

6. The diffusion lens of claim 1, wherein the plurality of specified shapes on the side surface are one of hemisphere shapes, semicircular tube shapes, or triangular tube shapes.

7. The diffusion lens of claim 6, wherein the hemisphere shapes on the side surface have a radius ranging from 0.05 mm to 0.15 mm.

8. The diffusion lens of claim 1, wherein the arbitrary shapes on the side surface have a height of 100 µm or less.

9. The diffusion lens of claim 1, wherein the plurality of specified shapes on the bottom surface are one of pyramid shapes, triangular prism shapes, or hemisphere shapes.

10. The diffusion lens of claim 1, wherein the plurality of specified shapes on the bottom surface are radially disposed.

11. The diffusion lens of claim 1, wherein the plurality of specified shapes on the bottom surface are randomly disposed.

12. The diffusion lens of claim 11, wherein the plurality of specified shapes on the bottom surface include a specified number of shapes disposed in a specified region.

13. The diffusion lens of claim 1, wherein the arbitrary shapes on the bottom surface have a height of 30 µm or less.

14. A diffusion lens comprising:

a first lens surface having a concave curved shape such that light generated from a light source is incident on the first lens surface;

a second lens surface having a convex curved shape such that part of the light incident on the first lens surface is output from the second lens surface;

a side surface extending from a periphery of the second lens surface in a vertical direction of the diffusion lens such that part of a remainder of the light incident on the first lens surface is output from the side surface by passing through the side surface; and a bottom surface extending from a periphery of the first lens surface in a horizontal direction of the diffusion lens to meet a periphery of the side surface, wherein a sign of a rate of change of curvature of the first lens surface is the same as a sign of rate of change of curvature of the second lens surface, wherein a pattern in which arbitrary shapes are irregularly disposed or a pattern in which specified shapes are regularly or irregularly disposed is formed on the side surface and the bottom surface to diffuse the light passing through the side surface and diffuse the light reflected by the bottom surface, wherein in the pattern formed on the side surface, the arbitrary shapes or the specified shapes extend from the periphery of the second lens surface to the periphery of the side surface that meets bottom surface, and wherein the first lens surface and the second lens surface have elliptical vertical sections, the first lens surface has a conic constant $-1 < k_1 < 0$, and the second lens surface has a conic constant $0 < k_2 < 20$.

* * * * *